(12) United States Patent
Saito et al.

(10) Patent No.: US 6,930,352 B2
(45) Date of Patent: Aug. 16, 2005

(54) INSULATED GATE SEMICONDUCTOR DEVICE

(75) Inventors: Wataru Saito, Kawasaki (JP); Ichiro Omura, Yokohama (JP); Satoshi Aida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 10/463,613

(22) Filed: Jun. 18, 2003

(65) Prior Publication Data

US 2004/0195618 A1 Oct. 7, 2004

(30) Foreign Application Priority Data

Apr. 7, 2003 (JP) ........................................ 2003-103151

(51) Int. Cl.$^7$ ............................................. H01L 29/76
(52) U.S. Cl. ................. 257/330; 257/327; 257/328; 257/329; 257/331; 257/341; 257/334; 257/355; 257/337; 257/379; 257/401; 257/167; 257/169; 257/133
(58) Field of Search ............................... 207/330, 327, 207/328, 329, 331, 341, 339, 401, 147, 149, 334; 257/166, 142, 148, 788, 30, 301, 327, 341, 330, 331, 334, 335

(56) References Cited

U.S. PATENT DOCUMENTS

| | | | |
|---|---|---|---|
| 5,751,024 A | * | 5/1998 | Takahashi .................... 257/139 |
| 5,883,402 A | | 3/1999 | Omura et al. |
| 6,700,156 B2 | * | 3/2004 | Saitoh et al. ................ 257/327 |
| 6,768,168 B1 | * | 7/2004 | Takahashi .................... 257/330 |
| 2003/0209741 A1 | * | 11/2003 | Saitoh et al. ................ 257/288 |

FOREIGN PATENT DOCUMENTS

| | | |
|---|---|---|
| JP | 2002-26324 | 1/2002 |
| JP | 3307785 | 5/2002 |

OTHER PUBLICATIONS

U.S. Appl. No. 10/463,613, filed Jun. 18, 2003, Saito et al.
U.S. Appl. No. 10/795,325, filed Mar. 9, 2004, Saito et al.
U.S. Appl. No. 10/321,613, filed Dec. 28, 2002, Saitoh et al.

* cited by examiner

*Primary Examiner*—Nathan J. Flynn
*Assistant Examiner*—Fazli Erdem
(74) *Attorney, Agent, or Firm*—Oblon, Spivak, McClelland, Maier & Neustadt, P.C.

(57) ABSTRACT

An insulated gate semiconductor device includes a control electrode having a trench type structure formed on the surface of a first semiconductor layer of a first conductivity type via a gate insulation film and disposed in a lattice shape, the control electrode having a plurality of first control electrode sections and a plurality of second control electrode sections which intersect with the plurality of first control electrode sections, respectively, and a plurality of fifth semiconductor layers of a second conductivity type which are provided on an interface of the first semiconductor layer in contact with the plurality of second control electrode sections, and connected to at least one of a plurality of second semiconductor layers of the second conductivity type, the fifth semiconductor layers having impurity concentration lower than that of the plurality of second semiconductor layers.

29 Claims, 13 Drawing Sheets

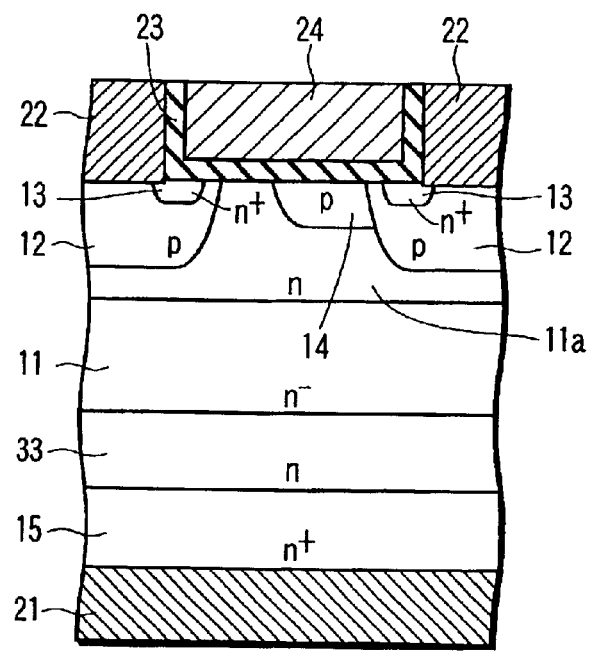
F I G. 18
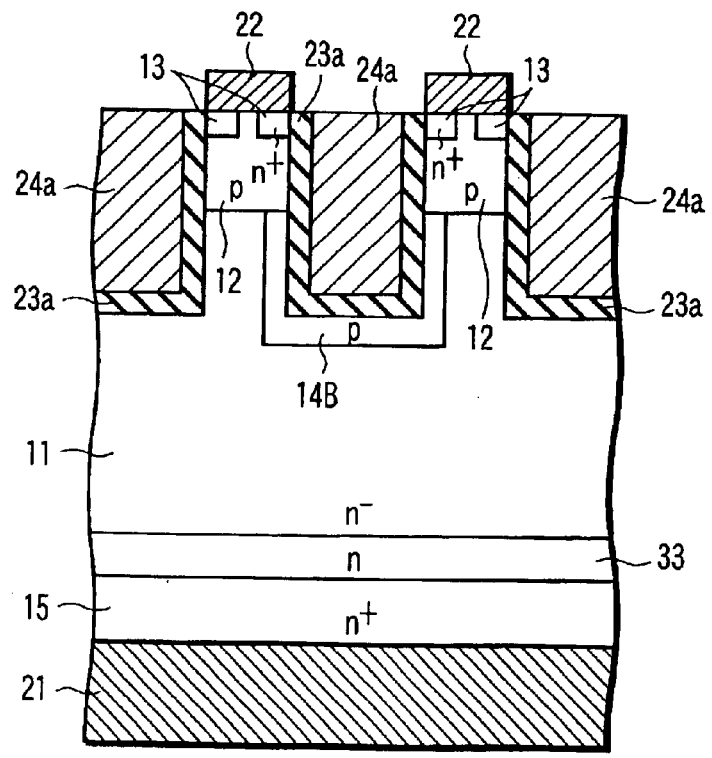
F I G. 19

INSULATED GATE SEMICONDUCTOR DEVICE

CROSS-REFERENCE TO RELATED APPLICATIONS

This application is based upon and claims the benefit of priority from the prior Japanese Patent Application No. 2003-103151, filed Apr. 7, 2003, the entire contents of which are incorporated herein by reference.

BACKGROUND OF THE INVENTION

1. Field of the Invention

The present invention relates to an insulated gate semiconductor device used for power control. More specifically, the invention relates to a MOS gate device such as a switching power MOSFET (metal oxide semiconductor field effect transistor) and an IGBT (insulated gate bipolar transistor), or a MIS (metal insulated semiconductor) gate element.

2. Description of the Related Art

In miniaturizing a power supply circuit such as a switching mode power supply, it is effect to increase switching frequency. In other words, it is effective to downsize a passive element such as an inductance and a capacitor in a power supply circuit. However, as the switching frequency is increased, a switching loss increases in switching elements such as a MOSFET and an IGBT. The increase in switching loss lowers the efficiency of a power supply. Therefore, in order to miniaturize the power supply circuit, it is essential to decrease the switching loss due to a speedup of switching elements.

In MOS gate elements, such as a MOSFET and an IGBT, currently used as switching elements, a gate length is shortened thereby to decrease the opposing area of gate and drain electrodes. Consequently, it is possible to increase the speed of the MOS gate elements by reducing gate-to-drain capacitance.

However, when the gate-to-drain capacitance is reduced to speed up the MOS gate elements, resonance occurs between parasitic inductance and switching element capacitance contained in wiring. The resonance becomes a factor in causing high-frequency noise (switching noise) at the time of switching. In order to suppress the switching noise, it is necessary to perform soft switching, or provide a filter circuit, or devise a gate drive circuit. The suppression of switching noise increases costs.

As described above, conventionally, it is possible to achieve high-speed switching by reducing gate-to-drain capacitance. However, it is necessary to suppress switching noise. For this purpose, it is necessary to perform soft switching or use an external circuit such as a filter circuit.

BRIEF SUMMARY OF THE INVENTION

According to a first aspect of the present invention, there is provided an insulated gate semiconductor device comprising: a first semiconductor layer of a first conductivity type; a plurality of second semiconductor layers of a second conductivity type selectively formed on a surface of the first semiconductor layer of the first conductivity type; at least one third semiconductor layer of the first conductivity type selectively formed on a surface of each of the plurality of second semiconductor layers of the second conductivity type; a plurality of first main electrodes connected to the plurality of second semiconductor layers of the second conductivity type and the at least one third semiconductor layer of the first conductivity type, respectively; a fourth semiconductor layer formed on a rear surface of the first semiconductor layer of the first conductivity type; a second main electrode connected to the fourth semiconductor layer; a control electrode having a trench type structure formed on the surface of the first semiconductor layer of the first conductivity type via a gate insulation film and disposed in a lattice shape, the control electrode having a plurality of first control electrode sections provided along a first direction, and a plurality of second control electrode sections which are provided along a second direction and which intersect with the plurality of first control electrode sections, respectively, and the plurality of first control electrode sections and the plurality of second control electrode sections being adjacent to the plurality of second semiconductor layers of the second conductivity type and the at least one third semiconductor layer of the first conductivity type; and a plurality of fifth semiconductor layers of the second conductivity type which are provided on an interface of the first semiconductor layer of the first conductivity type in contact with the plurality of second control electrode sections, and connected to at least one of the plurality of second semiconductor layers of the second conductivity type, the fifth semiconductor layers having impurity concentration lower than that of the plurality of second semiconductor layers of the second conductivity type.

According to a second aspect of the present invention, there is provided an insulated gate semiconductor device comprising: a first semiconductor layer of a first conductivity type; a plurality of second semiconductor layers of a second conductivity type selectively formed on a surface of the first semiconductor layer of the first conductivity type; at least one third semiconductor layer of the first conductivity type selectively formed on a surface of each of the plurality of second semiconductor layers of the second conductivity type; a plurality of first main electrodes connected to the plurality of second semiconductor layers of the second conductivity type and the at least one third semiconductor layer of the first conductivity type, respectively; a fourth semiconductor layer formed on a rear surface of the first semiconductor layer of the first conductivity type; a second main electrode connected to the fourth semiconductor layer; a plurality of control electrodes each having a trench type structure, formed via a gate insulation film and disposed in a stripe shape, on the surface of the first semiconductor layer of the first conductivity type, adjacent to the plurality of second semiconductor layers of the second conductivity type and the at least one third semiconductor layers of the first conductivity type, respectively; and a plurality of fifth semiconductor layers of the second conductivity type which are disposed in division on an interface of the first semiconductor layer of the first conductivity type in contact with the plurality of control electrodes, and connected to at least one of the plurality of second semiconductor layers of the second conductivity type, the fifth semiconductor layers having impurity concentration lower than that of the plurality of second semiconductor layers of the second conductivity type.

According to a third aspect of the present invention, there is provided an insulated gate semiconductor device comprising: a first semiconductor layer of a first conductivity type; a plurality of second semiconductor layers of a second conductivity type selectively formed on a surface of the first semiconductor layer of the first conductivity type; at least one third semiconductor layer of the first conductivity type selectively formed on a surface of each of the plurality of second semiconductor layers of the second conductivity type; a plurality of first main electrodes connected to the plurality of second semiconductor layers of the second conductivity type and the at least one third semiconductor layer of the first conductivity type, respectively; a fourth semiconductor layer formed on a rear surface of the first semiconductor layer of the first conductivity type; a second main electrode connected to the fourth semiconductor layer; a plurality of control electrodes each having a trench type structure, formed via a gate insulation film and disposed in a stripe shape, on the surface of the first semiconductor layer of the first conductivity type, adjacent to the plurality of second semiconductor layers of the second conductivity type and the at least one third semiconductor layer of the first conductivity type, respectively; and a plurality of fifth semiconductor layers of the second conductivity type which are disposed respectively on an interface of the first semiconductor layer of the first conductivity type in contact with at least bottom surface of the plurality of control electrodes, and connected to at least one of the plurality of second semiconductor layers of the second conductivity type, the fifth semiconductor layers having impurity concentration lower than that of the plurality of second semiconductor layers of the second conductivity type.

According to a fourth aspect of the present invention, there is provided an insulated gate semiconductor device comprising: a first semiconductor layer of a first conductivity type; a plurality of second semiconductor layers of a second conductivity type selectively formed on a surface of the first semiconductor layer of the first conductivity type; is at least one third semiconductor layer of the first conductivity type selectively formed on a surface of each of the plurality of second semiconductor layers of the second conductivity type; a plurality of first main electrodes connected to the plurality of second semiconductor layers of the second conductivity type and the at least one third semiconductor layer of the first conductivity type, respectively; a fourth semiconductor layer of the first conductivity type formed on a rear surface of the first semiconductor layer of the first conductivity type; a second main electrode connected to the fourth semiconductor layer of the first conductivity type; at least one control electrode formed via a gate insulation film on the surface of the first semiconductor layer of the first conductivity type, including the plurality of second semiconductor layers of the second conductivity type and the at least one third semiconductor layer of the first conductivity type; at least one fifth semiconductor layer of the second conductivity type disposed on an interface of the first semiconductor layer of the first conductivity type in contact with the at least one control electrode, and connected to at least one of the plurality of second semiconductor layers of the second conductivity type, the fifth semiconductor layer having impurity concentration lower than that of the plurality of second semiconductor layers of the second conductivity type; and a ninth semiconductor layer of the first conductivity type provided between the first semiconductor layer of the first conductivity type and the fourth semiconductor layer of the first conductivity type.

According to a fifth aspect of the present invention, there is provided an insulated gate semiconductor device comprising: a first semiconductor layer of a first conductivity type; a plurality of second semiconductor layers of a second conductivity type selectively formed on a surface of the first semiconductor layer of the first conductivity type; at least one third semiconductor layer of the first conductivity type selectively formed on a surface of each of the plurality of second semiconductor layers of the second conductivity type; a plurality of first main electrodes connected to the plurality of second semiconductor layers of the second conductivity type and the at least one third semiconductor layer of the first conductivity type, respectively; a fourth semiconductor layer of the first conductivity type formed on a rear surface of the first semiconductor layer of the first conductivity type; a second main electrode connected to the fourth semiconductor layer of the first conductivity type; at least one control electrode formed via a gate insulation film on the surface of the first semiconductor layer of the first conductivity type, including the plurality of second semiconductor layers of the second conductivity type and the at least one third semiconductor layer of the first conductivity type; at least one fifth semiconductor layer of the second conductivity type disposed on an interface of the first semiconductor layer of the first conductivity type in contact with the at least one control electrode, and connected to at least one of the plurality of second semiconductor layers of the second conductivity type, the fifth semiconductor layer having impurity concentration lower than that of the plurality of second semiconductor layers of the second conductivity type; and a tenth semiconductor layer of the second conductivity type provided in contact with bottom surfaces of the plurality of second semiconductor layer of the second conductivity type, respectively.

According to a sixth aspect of the present invention, there is provided an insulated gate semiconductor device comprising: a first semiconductor layer of a first conductivity type; a plurality of second semiconductor layers of a second conductivity type selectively formed on a surface of the first semiconductor layer of the first conductivity type; at least one third semiconductor layer of the first conductivity type selectively formed on a surface of each of the plurality of second semiconductor layers of the second conductivity type; a plurality of first main electrodes connected to the first semiconductor layer of the first conductivity type, the plurality of second semiconductor layers of the second conductivity type, and the at least one third semiconductor layer of the first conductivity type, respectively; a fourth semiconductor layer of the first conductivity type formed on a rear surface of the first semiconductor layer of the first conductivity type; a second main electrode connected to the fourth semiconductor layer of the first conductivity type; at least one control electrode formed via a gate insulation film on the surface of the first semiconductor layer of the first conductivity type, including the plurality of second semiconductor layers of the second conductivity type and the at least one third semiconductor layer of the first conductivity type; and at least one fifth semiconductor layer of the second conductivity type disposed on an interface of the first semiconductor layer of the first conductivity type in contact with the at least one control electrode, and connected to at least one of the plurality of second semiconductor layers of the second conductivity type, the fifth semiconductor layer having impurity concentration lower than that of the plurality of second semiconductor layers of the second conductivity type, wherein a Schottky junction is formed at a connection section between the first semiconductor layer of the first conductivity type and the first main electrode.

According to a seventh aspect of the present invention, there is provided an insulated gate semiconductor device comprising: a first semiconductor layer of a first conductivity type; a plurality of eleventh semiconductor layers of a second conductivity type selectively formed on a surface of the first semiconductor layer of the first conductivity type; a plurality of second semiconductor layers of the second conductivity type selectively formed on the surface of the first semiconductor layer of the first conductivity type including surfaces of the plurality of eleventh semiconductor layers of the second conductivity type; at least one third semiconductor layer of the first conductivity type selectively formed on a surface of each of the plurality of second semiconductor layers of the second conductivity type; a plurality of first main electrodes connected to the plurality of second semiconductor layers of the second conductivity type and the at least one third semiconductor layer of the first conductivity type, respectively; a fourth semiconductor layer formed on a rear surface of the first semiconductor layer of the first conductivity type; a second main electrode connected to the fourth semiconductor layer; at least one control electrode formed via a gate insulation film on the surface of the first semiconductor layer of the first conductivity type, including the plurality of second semiconductor layers of the second conductivity type and the at least one third semiconductor layer of the first conductivity type; and at least one fifth semiconductor layer of the second conductivity type disposed on an interface of the first semiconductor layer of the first conductivity type in contact with the at least one control electrode, and connected to at least one of the plurality of second semiconductor layers of the second conductivity type, the fifth semiconductor layer having impurity concentration lower than that of the plurality of second semiconductor layers of the second conductivity type.

BRIEF DESCRIPTION OF THE SEVERAL VIEWS OF THE DRAWING

FIG. 18 is a cross-sectional view showing an example of the application of the invention to a vertical power MOSFET that has a gate electrode of a planar type structure according to a third embodiment of the present invention.

FIG. 19 is a cross-sectional view showing an example of the application of the invention to a vertical power MOSFET that has a gate electrode of a trench type structure according to a third embodiment of the present invention.

DETAILED DESCRIPTION OF THE INVENTION

Embodiments of the present invention will now be described with reference to the accompanying drawings. In each of the embodiments, a first conductivity type is an n type, and a second conductivity type is a p type. A basic structure of a MOS gate element that has a gate-underlying p-type layer is disclosed in, for example, U.S. Pat. No. 10/183,457. Therefore, a detailed explanation of this structure will be omitted here.

(First Embodiment)

Figure 1:
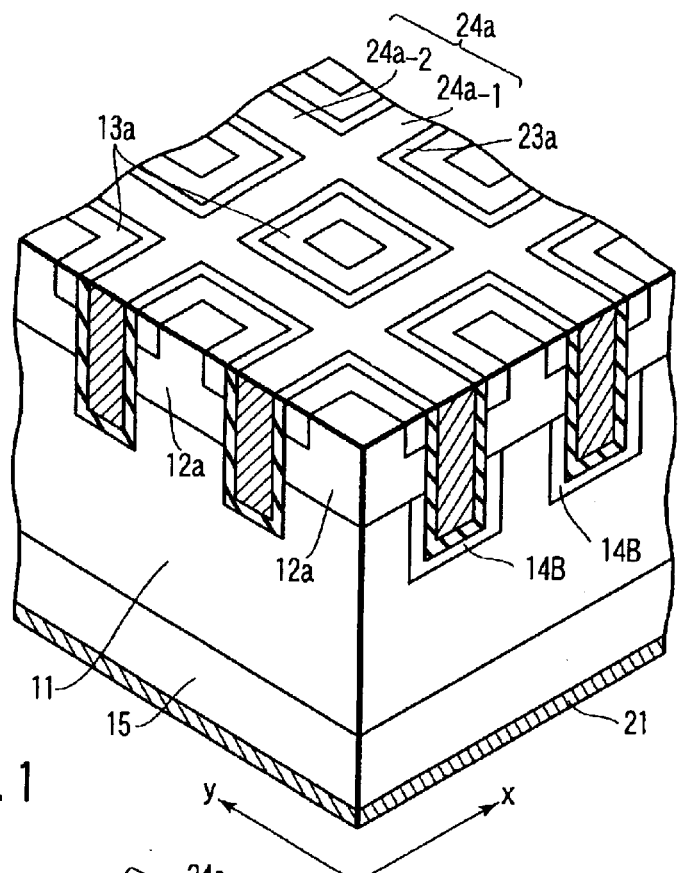
FIG. 1 is a partially cutaway perspective view showing a basic structure of a vertical power MOSFET according to a first embodiment of the present invention.

FIG. 1 shows a structure example of a vertical power MOSFET according to a first embodiment of the present invention. FIG. 1 shows an optional cross section of the vertical power MOSFET in an x direction (a first direction), and an optional cross section of the vertical power MOSFET in a y direction (a second direction), respectively. The present embodiment also shows an example that a gate electrode of a trench type structure is formed in a lattice shape.

In FIG. 1, a plurality of p-type base layers 12a are selectively formed by diffusion as second semiconductor layers on one surface of an n⁻-type drift layer 11 as a first semiconductor layer. The p-type base layers 12a are formed in a rectangular shape, and are disposed in a matrix shape (or in zigzag). A plurality of n⁺-type source layers 13a are selectively formed by diffusion as third semiconductor layers on the surfaces of the p-type base layers 12a. Each n⁺-type source layer 13a is provided to have a rectangular ring shape on the periphery of each p-type base layer 12a.

An n⁺-type drain layer 15 is formed as a fourth semiconductor layer on the rear surface (the other surface) of the n⁻-type drift layer 11. A drain electrode 21 is connected as a second main electrode on the entire surface of the n⁺-type drain layer 15.

On the other hand, a rectangular source electrode (not shown) is provided as a first main electrode on each upper surface of the p-type base layer 12a and the n⁺-type source layer 13a, respectively. A gate electrode 24a is embedded as a control electrode between the p-type base layers 12a via a gate insulation film (for example, a silicon (Si) oxide film) 23a. In other words, the gate electrodes 24a have a trench type structure, and are provided in a lattice shape along the surface of the n⁻-type drift layer 11 adjacent to the p-type base layer 12a and the n⁺-type source layer 13a, respectively.

In the present embodiment, each gate electrode 24a has substantially a constant width, and the gate electrodes 24a are laid out at substantially the same intervals (pitches). Each gate electrode 24a has substantially a constant depth, and is formed to have a larger depth than that of the bottom of each p-type base layer 12a. The gate insulation film 23a is formed to have substantially a constant film thickness.

A plurality of p-type layers (gate-underlying p-type layers) 14B are formed by diffusion as fifth semiconductor layers on the interface of the n⁻-type drift layer 11 corresponding to a plurality of second electrode sections $24a_{-2}$ along one direction of the gate electrode 24a. In other words, the p-type layers 14B are formed in a stripe shape on the interface of the n⁻-type drift layer 11 (the bottom surface and both side surfaces of the second electrode section $24a_{-2}$) that is in contact with the plurality of second electrode sections $24a_{-2}$ provided along a y direction that intersect with a plurality of first electrode sections $24a_{-1}$ that are provided in an x direction. The p-type layers 14B are connected with the two p-type base layers 12a that are adjacent to the second electrode sections $24a_{-2}$. Each p-type layer 14B is formed to have impurity concentration lower than that of the p-type base layer 12a.

As explained above, the p-type layers 14B are provided corresponding to only the second electrode sections $24a_{-2}$ among the gate electrodes 24a of the trench type structure disposed in a lattice shape. Based on the MOSFET having the above structure, it is also possible to realize high-speed and low-noise switching characteristics by utilizing characteristics that the gate-to-drain capacitance increases according to the drain voltage. In other words, when the gate electrode 24a is formed to have the second electrode section $24a_{-2}$ that is provided with the p-type layer 14B and the first electrode section $24a_{-1}$ that is not provided with the p-type layer 14B, the p-type layer 14B is easily depleted at the time when a high voltage is applied. Therefore, it is possible to realize high-speed and low-noise switching characteristics in the MOSFET. Consequently, according to the present embodiment, it is easily possible to realize a speed-up of the switching elements by decreasing the gate-to-drain capacitance at the time of the application of a low voltage, and realize low noise of the element by increasing the gate-to-drain capacitance at the time of the application of a high voltage.

Figure 2:
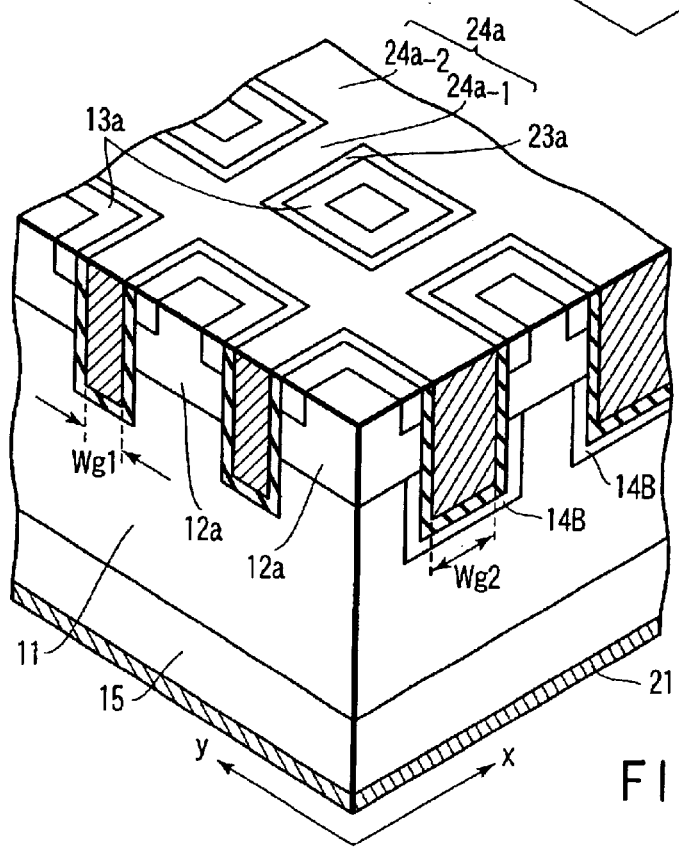
FIG. 2 is a perspective view showing an example that a width of a second electrode section on which a p-type layer is formed is set larger than a width of a first electrode section on which a p-type layer is not formed in the vertical power MOSFET shown in FIG. 1.

In the above embodiment (shown in FIG. 1), it is explained that each gate electrode 24a has substantially a constant width. In other words, the width of the second electrode section $24a_{-2}$ in an x direction and the width of the first electrode section $24a_{-1}$ in a y direction are formed to be substantially constant. However, the width relationship is not limited to this. For example, as shown in FIG. 2, it is also possible to form the gate electrode 24a such that the width (Wg2) of the second electrode section $24a_{-2}$ that is provided with the p-type layer 14B is larger than the width (Wg1) of the first electrode section $24a_{-1}$ (Wg2>Wg1). In this case, when a high voltage is applied, the area of the gate electrode 24a becomes larger than that when a low voltage is applied. Therefore, it is possible to further increase the gate-to-drain capacitance that increases at the time of the application of a high voltage. As a result, it is possible to realize the element of lower noise.

Figure 3:
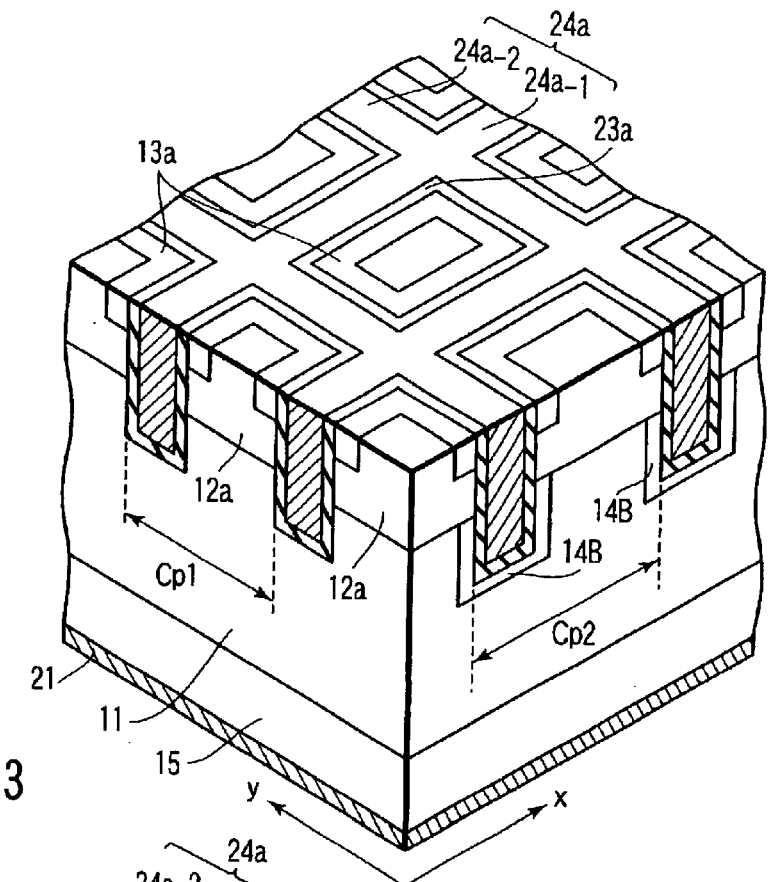
FIG. 3 is a perspective view showing an example that an interval between the second electrode sections on which the p-type layer is formed is set larger than an interval between the first electrode section on which the p-type layer is not formed in the vertical power MOSFET shown in FIG. 1.

In the above embodiment (shown in FIG. 1), it is explained that the interval between the second electrode sections $24a_{-2}$ in an x direction and the interval between the first electrode sections $24a_{-1}$ in a y direction are formed to be substantially constant. However, the interval relationship is not limited to this. For example, as shown in FIG. 3, it is also possible to form the gate electrode 24a such that the interval (Cp2) between the second electrode sections $24a_{-2}$ and the interval (Cp1) between the first electrode sections $24a_{-1}$ are different (Cp2≠Cp1). Based on this structure, as compared with the MOSFET shown in FIG. 1, it is possible to independently control on-resistance, high speed, and low noise of the switching elements, respectively. Specifically, in the structure shown in FIG. 1, when the interval between the second electrode sections $24a_{-2}$ is left as it is, and when the interval between the first electrode sections $24a_{-1}$ is formed smaller (Cp2>Cp1), it is possible to increase the channel width and lower the on-resistance. In this case, the ratio of the area of the p-type layer 14B to the area of the gate electrode 24a changes little. Therefore, the ratio of the increase in the gate-to-drain capacitance at the time of the application of a high voltage does not change either. Consequently, the low-noise characteristic is not lost. That is, it is possible to realize low on-resistance while keeping the low noise characteristic. On the other hand, when the interval between the second electrode sections $24a_{-2}$ is left as it is, and when the interval between the first electrode sections $24a_{-1}$ is formed larger (Cp2<Cp1), the on-resistance becomes large. However, it is possible to decrease the gate-to-drain capacitance at the time of the application of a low voltage, and it becomes possible to improve the high-speed characteristic.

In the structure shown in FIG. 1, it is explained that when the interval between the first electrode sections $24a_{-1}$ is left as it is, and when the interval between the second electrode sections $24a_{-2}$ is changed (Cp2>Cp1, Cp2<Cp1), it is possible to change the low-noise characteristic without substantially changing the on-resistance and high-speed characteristics.

Figure 4:
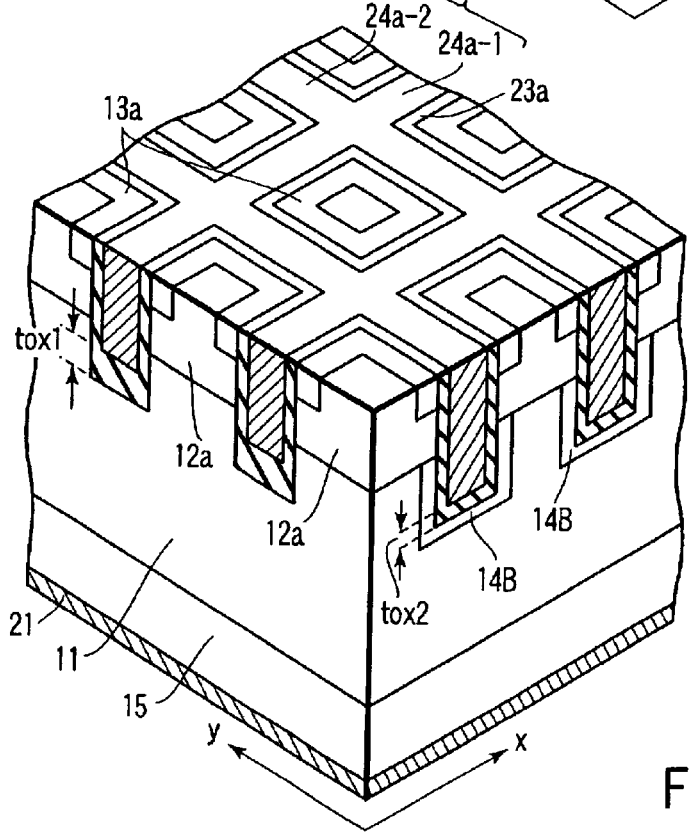
FIG. 4 is a perspective view showing an example that a film thickness of a gate insulation film at the bottom of the first electrode section on which the p-type layer is not formed is set larger than a thickness of other portion in the vertical power MOSFET shown in FIG. 1.

In the above embodiment (shown in FIG. 1), it is explained that the film thickness of the gate insulation film 23a is formed to be substantially constant. However, the film thickness relationship is not limited to this. For example, as shown in FIG. 4, it is also possible to form the gate insulation film 23a such that the film thickness (tox1) of the gate insulation film 23a at the bottom of the first electrode section $24a_{-1}$ is larger than the other portion (for example, the film thickness (tox2) of the gate insulation film 23a at the bottom of the second electrode section $24a_{-2}$) (tox2<tox1). Based on this structure, the gate-to-drain capacitance at the time of the application of a low voltage is determined according to the capacitance of the first electrode section $24a_{-1}$. In other words, it is possible to lower the gate-to-drain capacitance by increasing the thickness of the gate insulation film 23a at the bottom of the first electrode section $24a_{-1}$. Therefore, it is possible to increase the speed without losing the low-noise characteristic.

Figure 5:
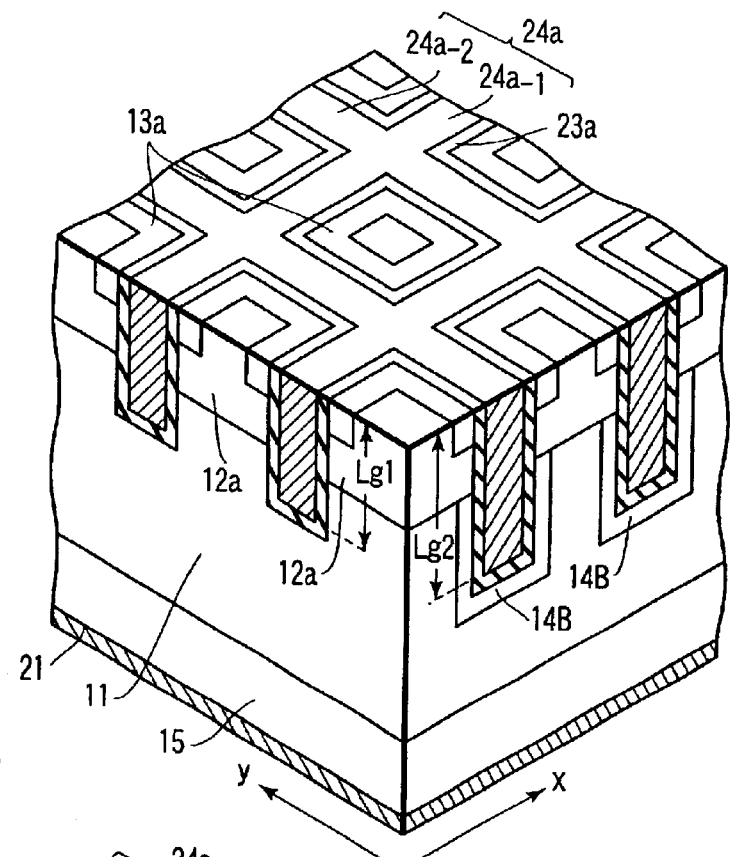
FIG. 5 is a perspective view showing an example that a length from the top surface to the bottom of the second electrode section on which the p-type layer is formed is set larger than a length from the top surface to the bottom of the first electrode section on which the p-type layer is not formed in the vertical power MOSFET shown in FIG. 1.

In the above embodiment (shown in FIG. 1), it is explained that the depth of the gate electrode 24a is formed to be substantially constant. However, the depth relationship is not limited to this. For example, as shown in FIG. 5, it is also possible to form the gate insulation film 23a such that the length (the depth Lg2) from the top surface to the bottom of the second electrode section $24a_{-2}$ is larger than the length (the depth Lg1) from the top surface to the bottom of the first electrode section $24a_{-1}$ (Lg2>Lg1). Based on this structure, it is possible to set the p-type layer 14B closer to the drain electrode 21. Therefore, it is possible to concentrate the electric line of force from the drain electrode 21 to the p-type layer 14B. As a result, it is possible to make large the change in the gate-to-drain capacitance. As it is possible to make small the gate-to-drain capacitance at the time of the application of a low voltage, it is possible to realize the low-noise and high-speed characteristics.

Figure 6:
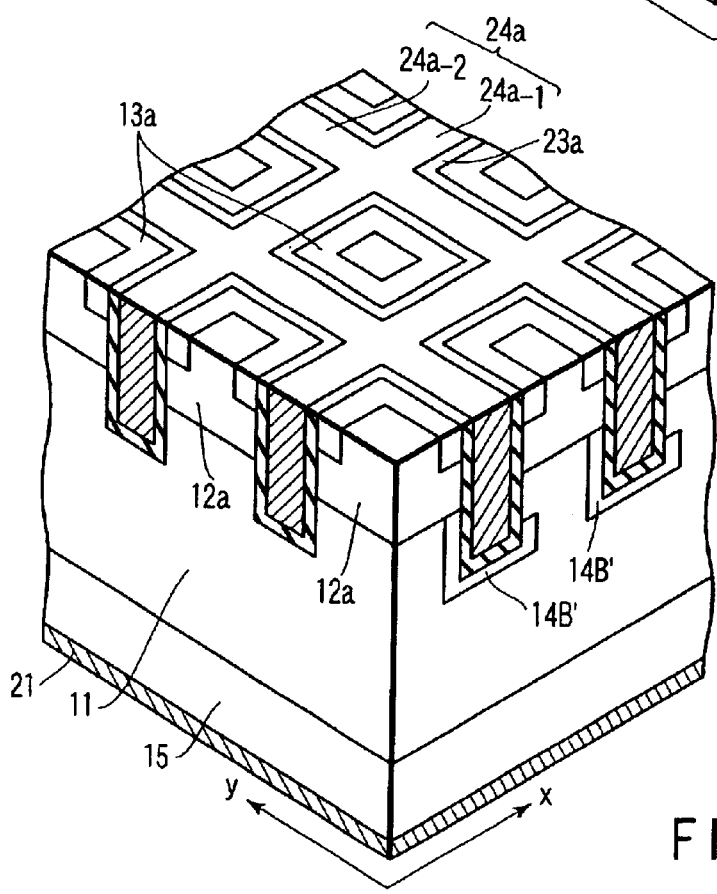
FIG. 6 is a perspective view showing an example that the p-type layer is formed along only the bottom surface and at least one side of the second electrode section in the vertical power MOSFET shown in FIG. 1.

In the above embodiment (shown in FIG. 1), it is explained that the p-type layer 14B is provided along the bottom surface and both side surfaces of the second electrode section $24a_{-2}$. However, the position of the provision of the p-type layer is not limited to this. For example, as shown in FIG. 6, it is also possible to form a p-type layer 14B' along the bottom surface and at least one side surface of the second electrode section $24a_{-2}$. Based on this structure, it is possible to increase the channel width of the portion not covered with the p-type layer 14B'. Therefore, it is possible to lower the on-resistance without losing the low-noise and high-speed characteristics.

Figure 7:
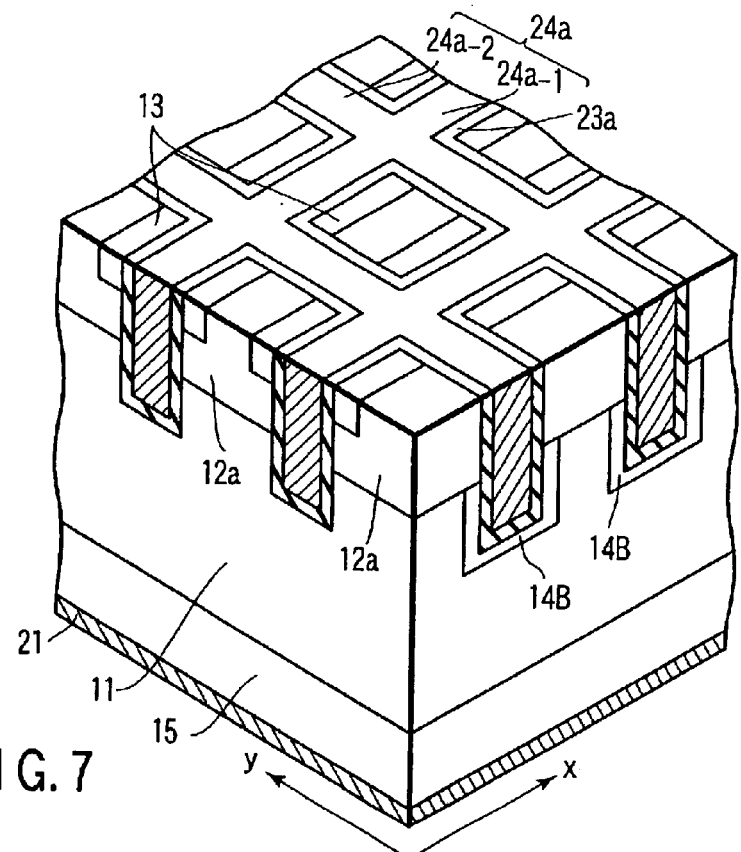
FIG. 7 is a perspective view showing an example that an $n^+$-type source layer is formed along only the first electrode section in the vertical power MOSFET shown in FIG. 1.

In the above embodiment (shown in FIG. 1), it is explained that the $n^+$-type source layer 13a is formed in a ring shape. In other words, it is explained that the $n^+$-type source layer 13a is formed along the first electrode section $24a_{-1}$ and the second electrode section $24a_{-2}$, respectively. However, the position of the provision of the $n^+$-type source layer 13a is not limited to this. For example, as shown in FIG. 7, it is also possible to form the $n^+$-type source layer 13a along only the first electrode section $24a_{-1}$. Based on this structure, it is possible to increase the robustness in avalanche condition corresponding to the amount by which the parasitic bipolar transistor cannot operate.

In the above embodiment, it is also possible to suitably combine the examples (shown in FIG. 1 to FIG. 7).

Figure 8:
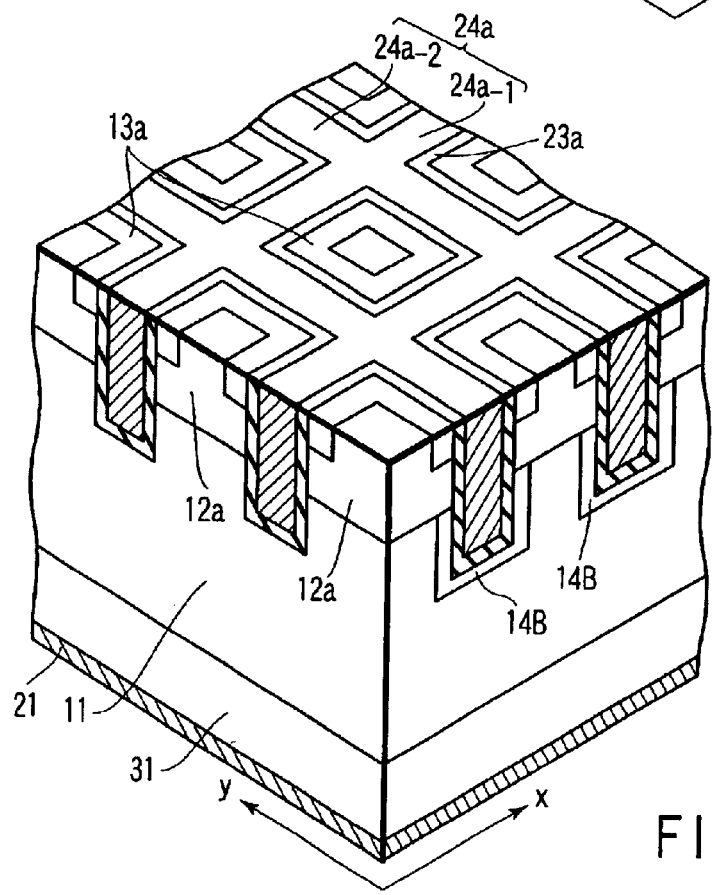
FIG. 8 is a partially cutaway perspective view showing an example of an IGBT of a non-punch-through type structure according to the first embodiment of the present invention.

In the above examples (shown in FIG. 1 to FIG. 7) of the embodiment, the application of the present invention to the vertical power MOSFET is explained. However, the application of the invention is not limited to this type. For example, as shown in FIG. 8, it is also possible to apply the invention to an IGBT of a non-punch-through type structure. In the case of the IGBT of the non-punch-through type structure, a $p^+$-type drain layer 31 is provide in place of the $n^+$-type drain layer.

Figure 9:
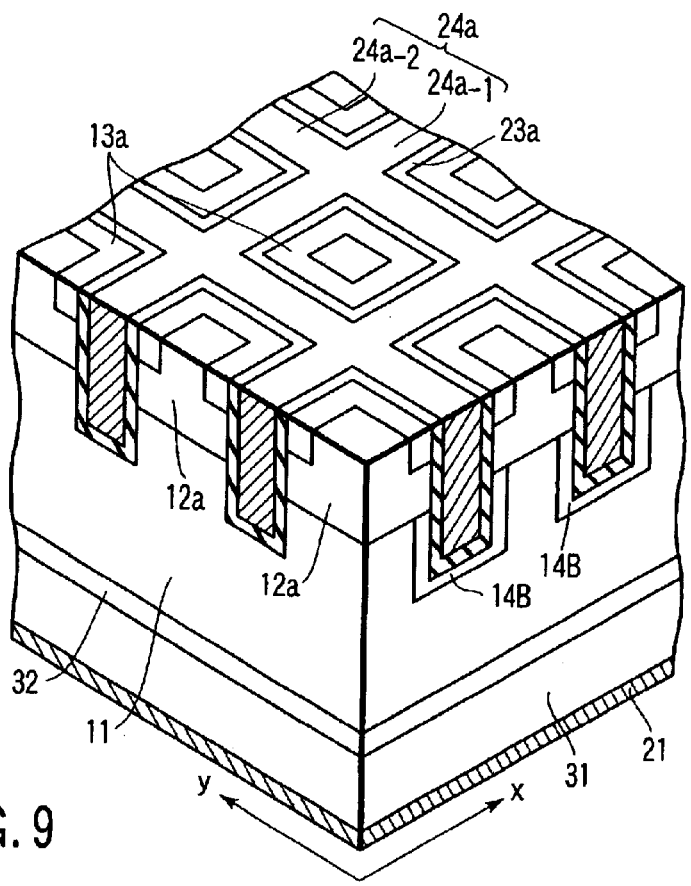
FIG. 9 is a partially cutaway perspective view showing an example of an IGBT of a punch-through type structure according to the first embodiment of the present invention.

It is also possible to apply the invention to an IGBT of a punch-through type structure as shown in FIG. 9, without limiting the application to the IGBT of the non-punch-through type structure shown in FIG. 8. In the case of the IGBT of the punch-through type structure, an $n^+$-type buffer layer 32 is also provided as a sixth semiconductor layer between the $n^-$-type drift layer 11 and the $p^+$-type drain layer 31.

In each of the above examples (shown in FIG. 1 to FIG. 9) of the embodiment, it is also possible to form an n-type low-resistance layer having a higher impurity concentration than that of the $n^-$-type drift layer 11 on the surface of the $n^-$-type drift layer 11.

(Second Embodiment)

Figure 10:
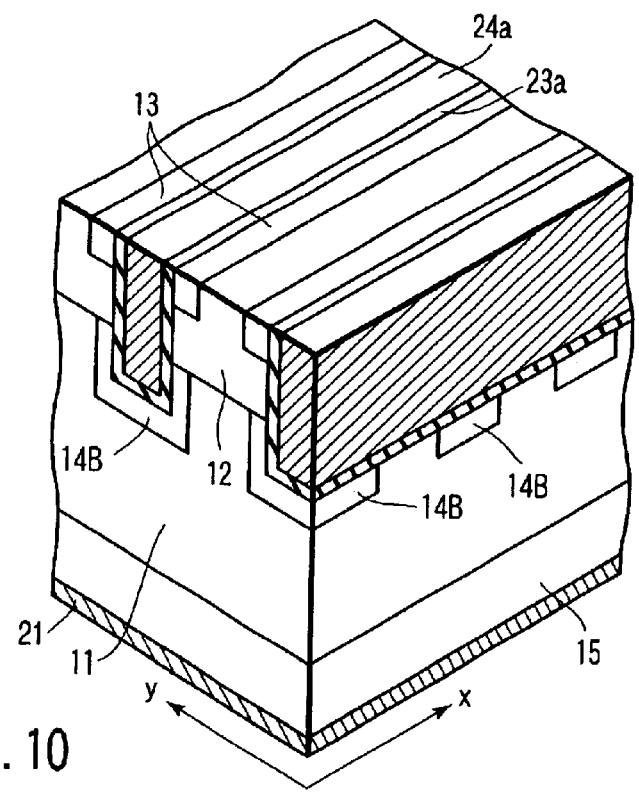
FIG. 10 is a partially cutaway perspective view showing a basic structure of a vertical power MOSFET according to a second embodiment of the present invention.

FIG. 10 shows a structure example of a vertical power MOSFET according to a second embodiment of the present invention. FIG. 10 shows an optional cross section of the vertical power MOSFET in an x direction, and an optional cross section of the vertical power MOSFET in a y direction, respectively. The present embodiment also shows an example that a gate electrode of a trench type structure is formed in a stripe shape.

In FIG. 10, a plurality of p-type base layers 12 are selectively formed by diffusion as second semiconductor layers on one surface of an $n^-$-type drift layer 11 as a first semiconductor layer. The p-type base layers 12 have constant intervals (pitches) between them in a y direction, and are disposed in a stripe shape along an x direction. A plurality of $n^+$-type source layers 13 are selectively formed by diffusion as third semiconductor layers on the surface of the p-type base layers 12. Each $n^+$-type source layer 13 is provided to have a stripe shape on the end of each p-type base layer 12 along an x direction.

An $n^+$-type drain layer 15 is formed as a fourth semiconductor layer on the rear surface (the other surface) of the $n^-$-type drift layer 11. A drain electrode 21 is connected as a second main electrode on the entire surface of the $n^+$-type drain layer 15.

On the other hand, a stripe-shape source electrode (not shown) is provided as a first main electrode on each upper surface of the p-type base layer 12 and the $n^+$-type source layer 13, respectively. A gate electrode 24a is embedded as a control electrode between the p-type base layers 12 via a gate insulation film (for example, a silicon (Si) oxide film) 23a. Namely, the gate electrodes 24a have a trench type structure, and are provided in a stripe shape on the surface of the $n^-$-type drift layer 11 along the p-type base layer 12 and the $n^+$-type source layer 13, respectively. Each gate electrode 24a has substantially a constant depth, and is formed to have a larger depth than that of the bottom of each p-type base layer 12. The gate insulation film 23a is formed to have substantially a constant film thickness.

A plurality of p-type layers (gate-underlying p-type layers) 14B are formed by diffusion as fifth semiconductor layers corresponding to a plurality of local sections of the gate electrode 24a. In other words, the p-type layers 14B are disposed in division to the interface of the $n^-$-type drift layer 11 that is in contact with the gate electrode 24a (the bottom surface and both sides of the gate electrode 24a). The p-type layers 14B are connected with the two p-type base layers 12 that are adjacent to the gate electrode 24a. Each p-type layer 14B is formed to have impurity concentration lower than that of the p-type base layer 12.

Based on the above, structure, it is possible to realize high-speed and low-noise switching characteristics that are substantially similar to those of the MOSFET having the structure shown in FIG. 1. It is also possible to form the depletion p-type layer 14B in substantially a constant area without a positional deviation.

Figure 11:
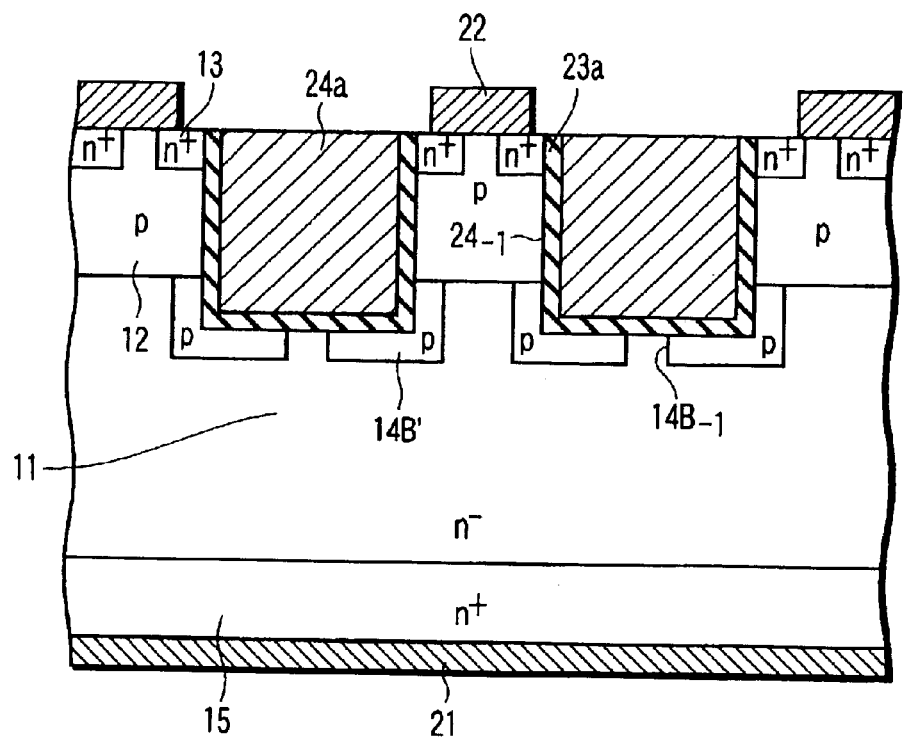
FIG. 11 is a cross-sectional view showing an example that a p-type layer is formed by providing an opening such that a part of the bottom of a gate electrode is exposed in the vertical power MOSFET shown in FIG. 10.

In the above embodiment (shown in FIG. 10), it is explained that the p-type layer 14B is provided along the bottom surface and both side surfaces of the gate electrode 24a. However, the position of the provision of the p-type layer 14B is not limited to this. For example, as shown in FIG. 11, it is also possible to form a p-type layer 14B' by providing an opening $14B_{-1}$ so as not to cover a part of the bottom of the gate electrode 24a. It is possible to easily form the p-type layer 14B', by forming a trench $24_{-1}$ to prepare the gate electrode 24a, adjusting an angle, and injecting an ion from a slanted direction of the trench $24_{-1}$. Based on this structure, it is also possible to realize high-speed and low-noise switching elements. Further, as a path for flowing a current is formed on the bottom of the gate electrode 24a, it is possible to suppress an increase in the on-resistance.

In FIG. 11, a reference numeral 22 denotes a source electrode having a stripe shape that is provided as a first main electrode on the upper surface of the p-type base layer 12 and the n⁺-type source layer 13, respectively.

Figure 12:
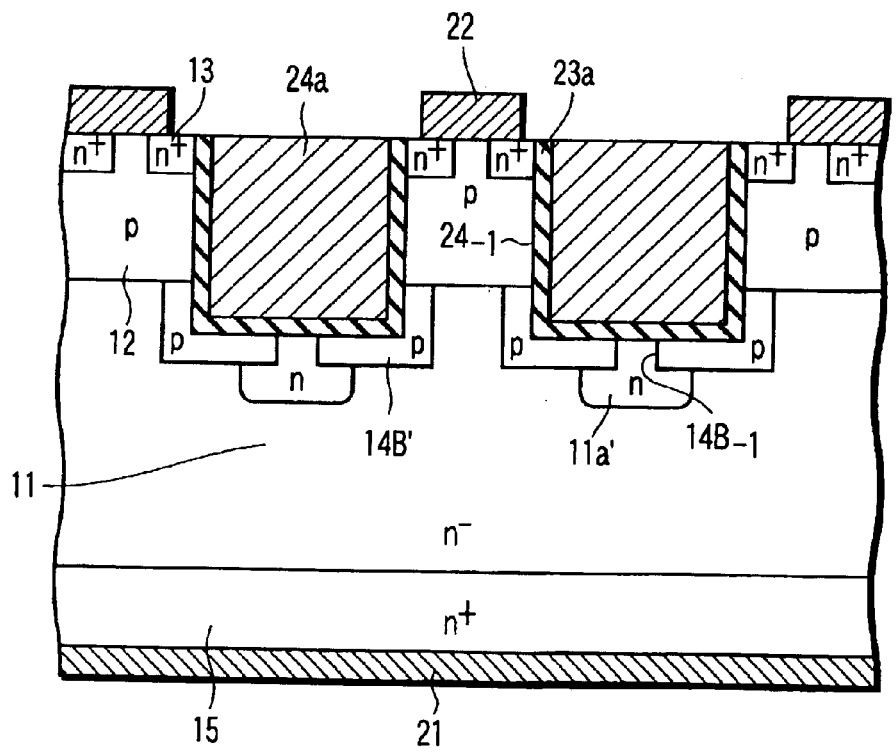
FIG. 12 is a cross-sectional view showing an example that an n-type low-resistance layer is formed on the opening provided on the p-type layer in the vertical power MOSFET shown in FIG. 11.

When the width of the opening $14B_{-1}$ becomes small, the on-resistance becomes large. In order to prevent the width of the opening $14B_{-1}$ from becoming small due to a heat treatment in the manufacturing process, n-type low-resistance layers $11a'$ may be selectively formed as seventh semiconductor layers on the opening $14B_{-1}$, as shown in FIG. 12. The n-type low-resistance layers $11a'$ are formed to have a higher impurity concentration than that of the n⁻-type drift layers 11.

Figure 13:
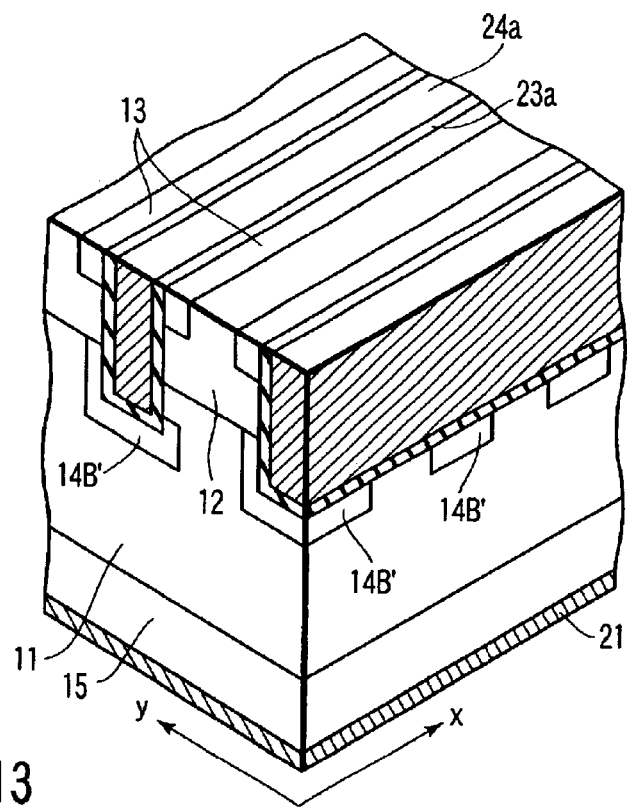
FIG. 13 is a perspective view showing an example that the p-type layer is formed on the bottom surface and on only at least one side of the gate electrode in the vertical power MOSFET shown in FIG. 10.

In the above embodiment (shown in FIG. 10), it is explained that the p-type layer 14B is provided along the bottom surface and both side surfaces of the gate electrode 24a. However, the position of the provision of the p-type layer 14B is not limited to this. For example, as shown in FIG. 13, it is also possible to form the p-type layer 14B' along the bottom surface and at least one side surface of the gate electrode 24a. Based on this structure, it is possible to have a large channel width at a portion not covered by the p-type layer 14B'. Therefore, it is possible to lower the on-resistance without losing the low-noise and high-speed characteristics.

Figure 14:
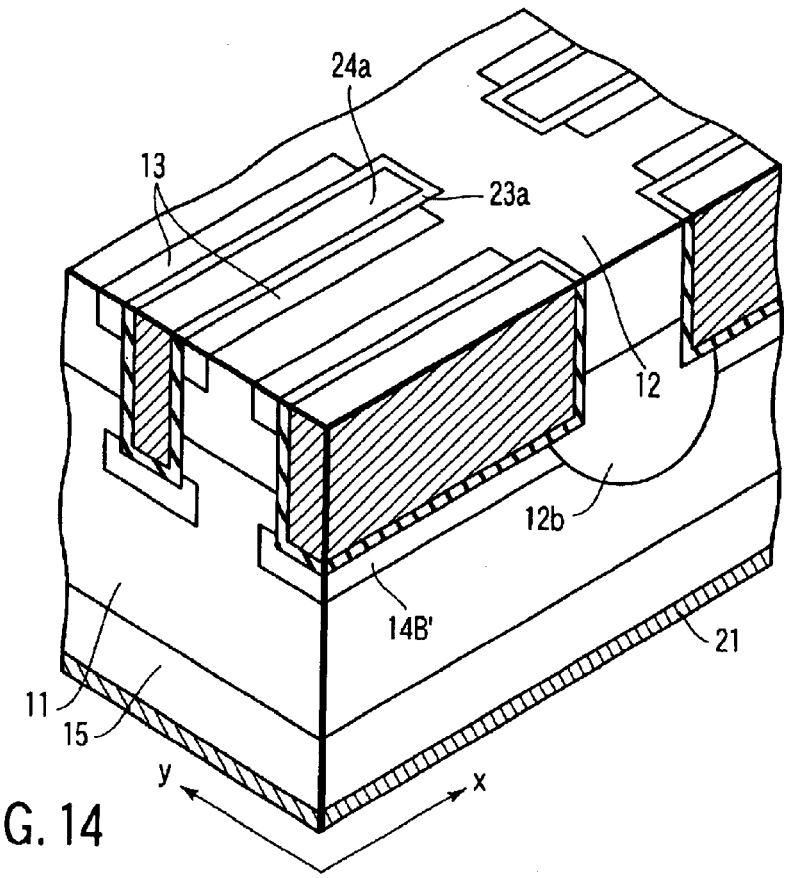
FIG. 14 is a partially cutaway perspective view of a vertical power MOSFET that has the p-type layer formed on only the bottom surface of the gate electrode according to the second embodiment of the present invention.
Figure 15:
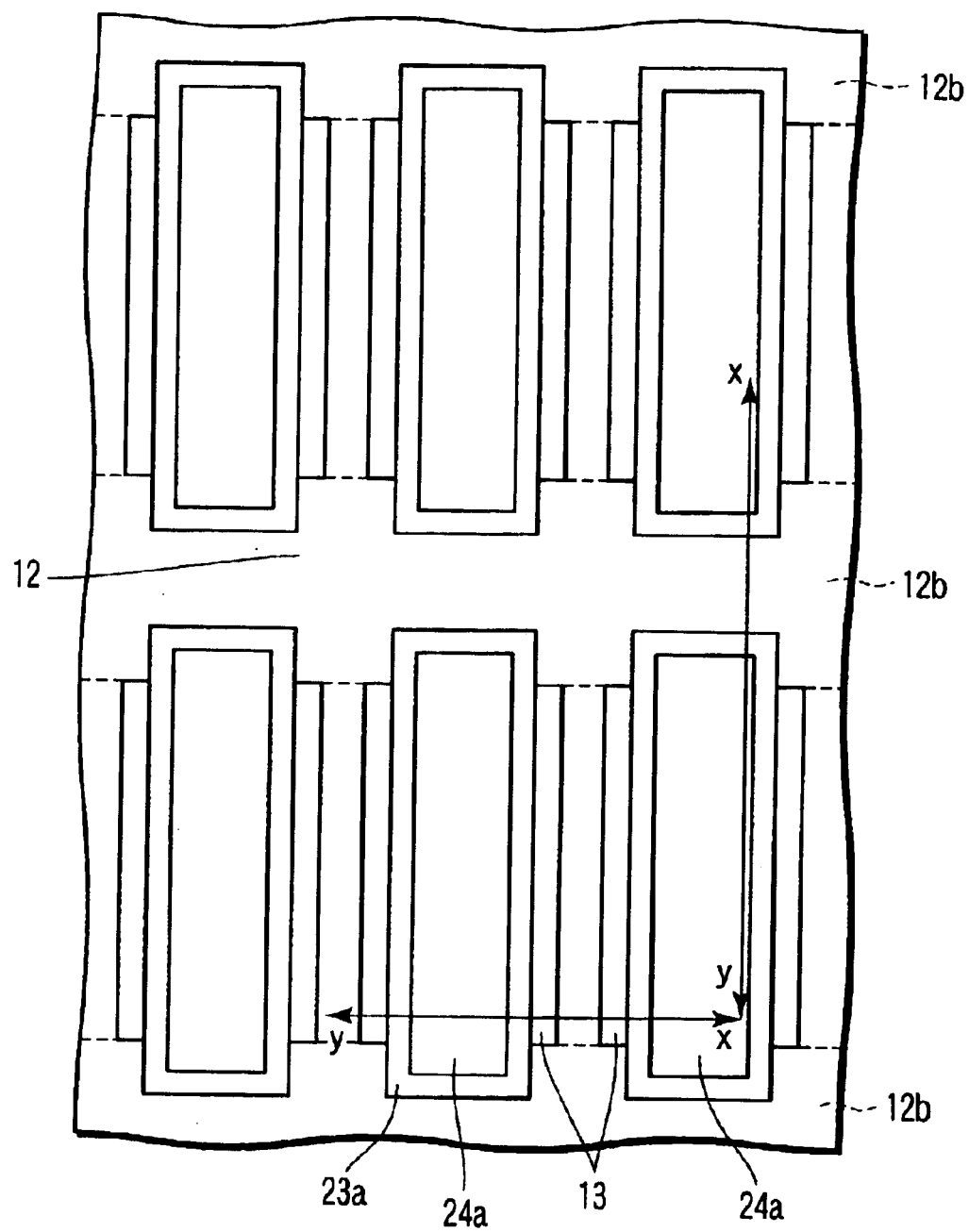
FIG. 15 is a plan view showing the vertical power MOSFET shown in FIG. 14.

As shown in FIG. 14 and FIG. 15, the p-type layers 14B' may be provided along only the bottom surface of the gate electrode 24a, respectively. In this case, the p-type layers 14B' are connected to the p-type base layer 12 via p-type base connection layers 12b that are provided as eighth semiconductor layers between the gate electrodes 24a in an x direction. Based on this structure, the p-type layers 14B' do not exist on the side surfaces of the gate electrode 24a. Therefore, it is possible to suppress an increase in the on-resistance corresponding to the width of the channel that is small due to the absence of the p-type layer 14B'. The gate-to-drain capacitance is determined substantially based on the area of the bottom of the gate electrode 24a. Consequently, it is possible to reduce the gate-to-drain capacitance infinitely to zero at the time of the application of a low voltage, by completely covering the bottom of the gate electrode 24a with the p-type layer 14B'. As a result, it is possible to realize the speed up.

Particularly, the p-type layer 14B' can charge and discharge an electron by connecting the p-type layer 14B' to the p-type base layer 12 via the p-type base connection layer 12b. In this case, the p-type layer 14B' can quickly charge and discharge holes, when the gate electrodes 24a are disposed by making small the interval between the p-type base connection layers 12b as shown in FIG. 15.

Figure 16:
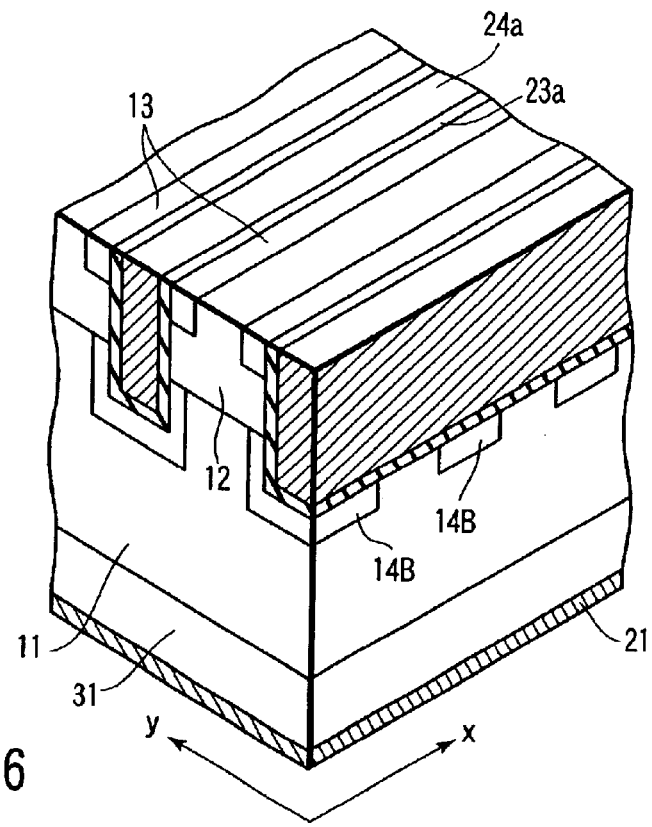
FIG. 16 is a partially cutaway perspective view showing an example of an IGBT of a non-punch-through type structure according to the second embodiment of the present invention.
Figure 17:
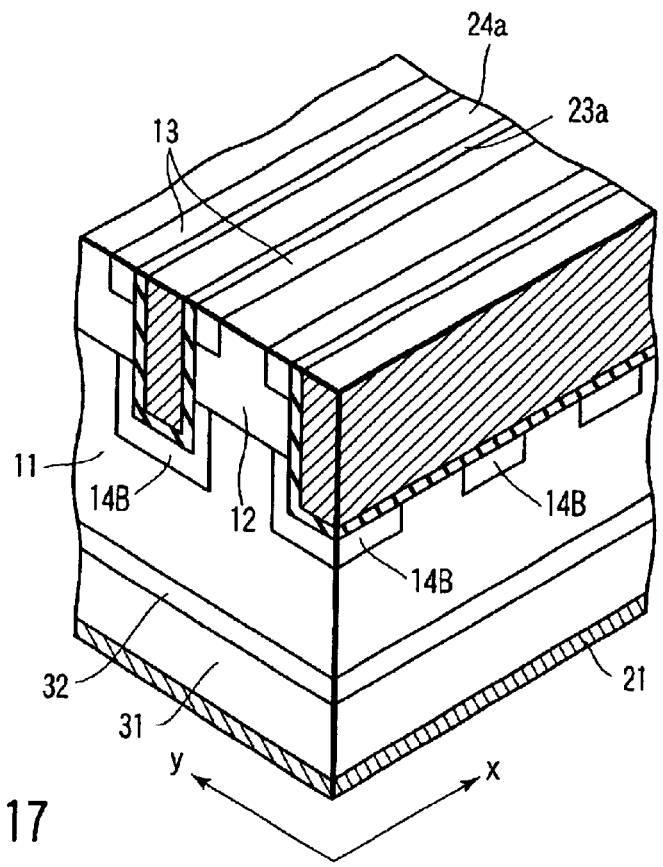
FIG. 17 is a partially cutaway perspective view showing an example of an IGBT of a punch-through type structure according to the second embodiment of the present invention.

In the above examples (shown in FIG. 10 to FIG. 15) of the embodiment, it is explained that the present invention is applied to the MOSFET. However, the application of the invention is not limited to the above. For example, it is also possible to apply the invention to an IGBT of a non-punch-through type structure as shown in FIG. 16. Similarly, it is also possible to apply the invention to an IGBT of a punch-through type structure as shown in FIG. 17.

In the above examples (shown in FIG. 10 to FIG. 17) of the embodiment, it is also possible to form an n-type low-resistance layer having a higher impurity concentration than that of the n⁻-type drift layer 11, on the surface of the n⁻-type drift layer 11.

(Third Embodiment)

FIG. 18 shows a structure example of a vertical power MOSFET according to a third embodiment of the present invention. The present embodiment shows an example that an n-type low-resistance layer 11a is formed on the surface of an n⁻-type drift layer 11.

The MOSFET according to the present embodiment can overcome a loss or noise generated when a pn-type diode (a body diode) that is formed by an n⁻-type drift layer and a p-type base layer is switched from the on state to the off state (a recovery time). It is known that the loss or noise generated at the recover time of the body diode gives a large influence to a loss or noise of a power supply circuit, when the MOSFET is used for the power supply circuit of a smaller inverter circuit (a single phase) or a bridge circuit.

In FIG. 18, the n⁻-type drift layer 11 as a first semiconductor layer has the n-type low-resistance layer 11a formed by diffusion on one surface of the n⁻-type drift layer 11. A plurality of p-type base layers 12 are selectively formed by diffusion as second semiconductor layers on the surface of the n-type low-resistance layer 11a. The p-type base layers 12 have constant intervals (pitches) between them in a direction parallel with the front surface of an element, and are disposed in a stripe shape along a direction orthogonal with the front surface of the element. A plurality of n⁺-type source layers 13 are selectively formed by diffusion as third semiconductor layers on the surface of the p-type base layers 12. The n⁺-type source layers 13 are provided in a stripe shape along the p-type base layers 12.

A p-type layer (a gate-underlying p-type layer) 14 is selectively formed by diffusion as a fifth semiconductor layer on the surface of the n-type low-resistance layer 11a between two adjacent p-type base layers 12. In the present embodiment, the p-type layer 14 is provided in a stripe shape on the surface of the n-type low-resistance layer 11a that is in contact with the p-type base layers 12, along the interface with the p-type base layers 12. Namely, the p-type layer 14 is connected to one of the two adjacent p-type base layers 12. The p-type layer 14 is formed to have impurity concentration lower than that of the p-type base layer 12.

A source electrode 22 having a stripe shape is provided as a first main electrode on the upper surface of the p-type base layer 12 and the n⁺-type source layer 13, respectively. A gate electrode 24 is provided as a control electrode in a stripe shape between the source electrodes 22 via a gate insulation film (for example, a silicon (Si) oxide film) 23. In other words, the gate electrode 24 of a planar type structure is formed on an area from the n$^+$-type source layer 13 within one of the p-type base layers 12 to the n$^+$-type source layer 13 within the other p-type base layer 12 via the p-type layer 14 and the n-type low-resistance layer 11a. The gate insulation film 23 is formed to have substantially a constant film thickness (for example, about 0.1 μm).

An n-type buffer layer 33 is provided as a ninth semiconductor layer on the rear surface (the other surface) of the n$^-$-type drift layer 11. An n$^+$-type drain layer 15 is formed as a fourth semiconductor layer via the n-type buffer layer 33. A drain electrode 21 is connected as a second main electrode to the entire surface of the n$^+$-type drain layer 15.

Based on this structure, it is possible to soften a change in the current at the recovery time. As a result, it is possible to reduce noise due to the body diode. In other words, at the recovery time, a depletion layer extends from the p-type base layer 12 toward the n$^+$-type drain layer 15, and reaches the n-type buffer layer 33. Based on a gradual depletion of the inserted n-type buffer layer 33, an increase in the electric field within the n$^-$-type drift layer 11 is suppressed. As a result, it becomes possible to prevent a sudden reduction in the current, and it becomes possible to reduce noise at the recovery time of the body diode. It is not only possible to soften a change in the current at the recovery time, but it is also possible to soften the switching of the MOSFET.

It is preferable that the n-type buffer layer 33 has an impurity concentration that is not too high and that makes it possible to easily deplete based on the application of a high voltage (for example, about ten times the concentration of the n$^-$-type drift layer 11).

In the above embodiment (shown in FIG. 18), it is explained that the present invention is applied to the MOSFET having the gate electrode 24 of a planar type structure. However, the application of the present invention is not limited to this. For example, as shown in FIG. 19, it is also possible to apply the invention to the MOSFET having a gate electrode 24a of a trench type structure. Similarly, it is also possible to apply the invention to the MOSFET having the gate electrode 24a of a trench type structure in which an n-type low-resistance layer is formed.

Figure 20:
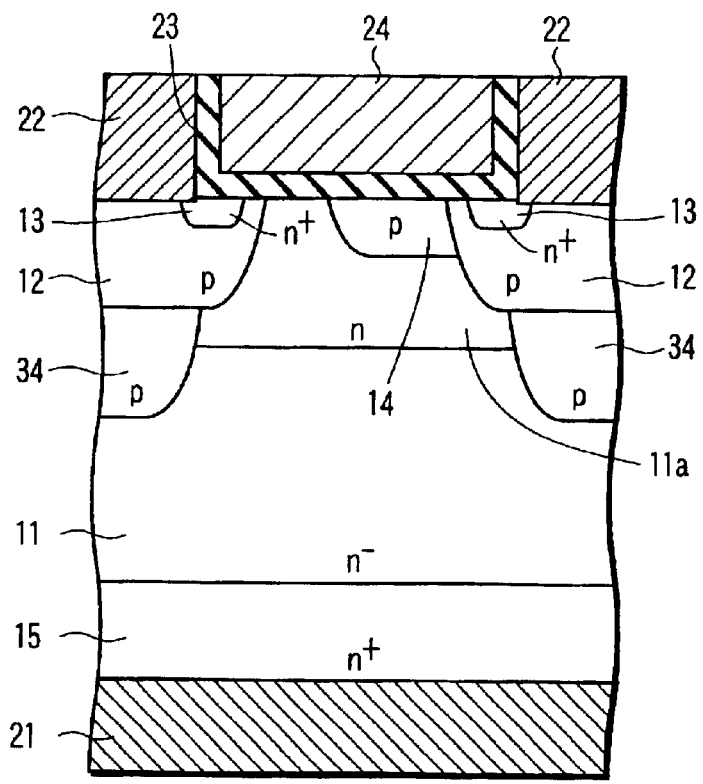
FIG. 20 is a cross-sectional view showing another example of the application of the invention to a vertical power MOSFET that has a gate electrode of a planar type structure according to the third embodiment of the present invention.

It is also possible to obtain a similar effect when a p-type buffer layer 34 is inserted as a tenth semiconductor layer into the bottom surface of the p-type base layer 12, as shown in FIG. 20. That is, it is possible to reduce noise due to the built-in diode, by gradually depleting the p-type buffer layer 34 at the recovery time. While the MOSFET formed with the n-type low-resistance layer 11a is explained as an example, it is also possible to apply the invention to the MOSFET in which the n-type low-resistance layer 11a is not formed. Similarly, it is also possible to apply the invention to the MOSFET that has the p-type buffer layer 34 inserted and that has a gate electrode of a trench type structure.

Figure 21:
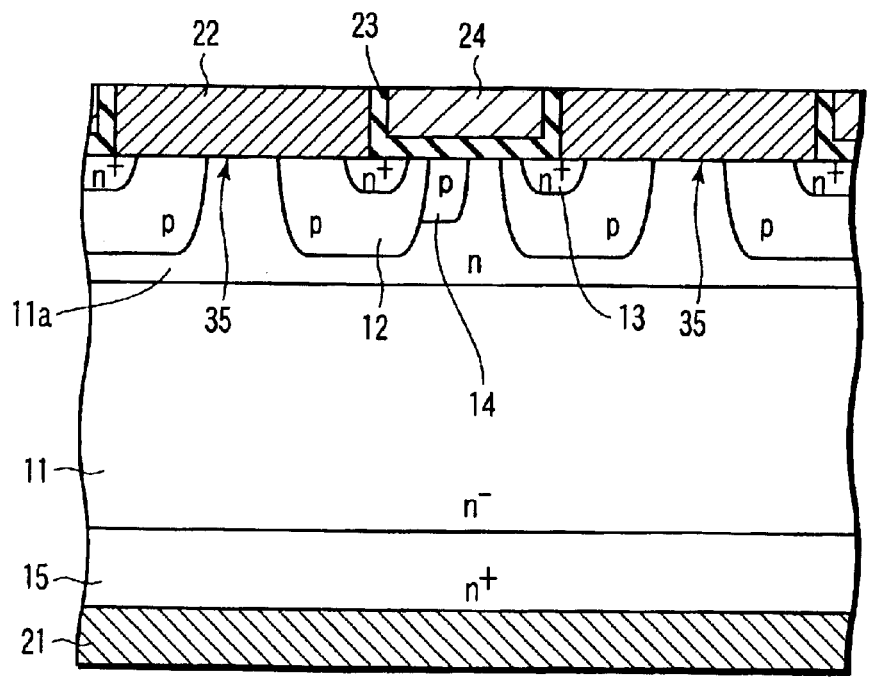
FIG. 21 is a cross-sectional view of a vertical power MOSFET showing an example that a Schottky junction is formed according to the third embodiment of the present invention.

In the examples (shown in FIG. 18 to FIG. 20) of the embodiment, it is explained that noise at the recovery time of the body diode is reduced by providing the buffer layers 33 and 34. However, the arrangement is not limited to the noise reduction. For example, as shown in FIG. 21, it is also possible to reduce a loss at the recovery time of the body diode, by forming a Schottky junction 35 between the n$^-$-type drift layer 11 and the source electrode 22. In other words, when the diode built in the MOSFET includes a pn diode and a Schottky barrier diode (hereinafter referred to as an SBD), it is possible to lower the concentration of the carrier existing in the n$^-$-type drift layer 11 at the on state of the body diode. Based on this, it is possible to suppress the number of carriers at the recovery time, thereby to reduce the recovery current. Consequently, it is possible to reduce the loss due to the body diode at the recovery time. When the loss at the recovery time is reduced based on the provision of the SBD, the loss-reduction controllability according to this method is superior to that when the loss at the recovery time is reduced based on a known life time control.

Figure 22:
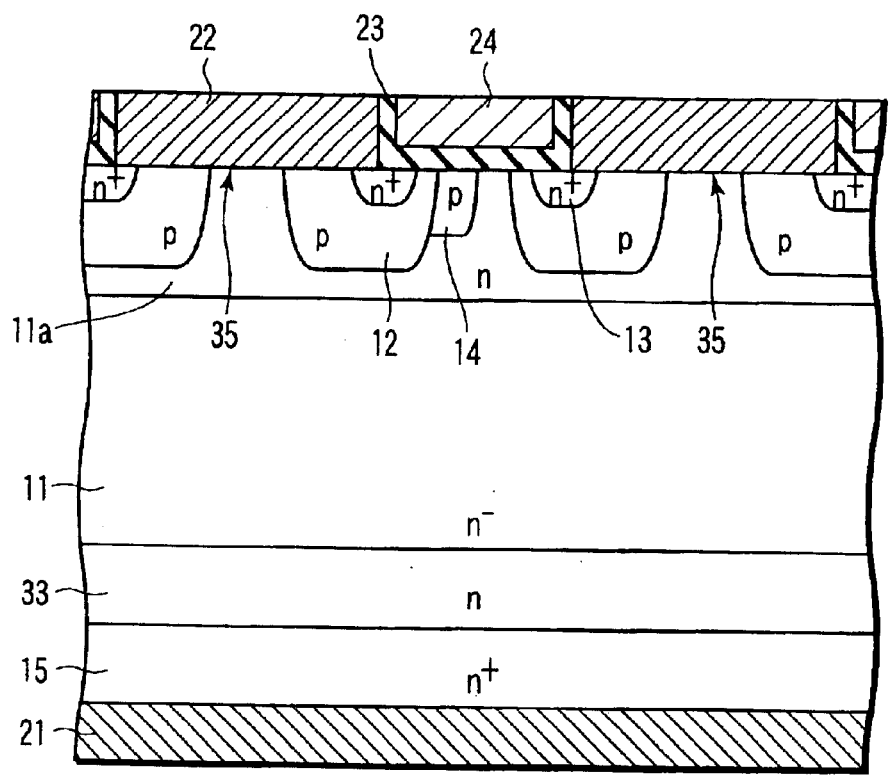
FIG. 22 is a cross-sectional view showing an example that a Schottky junction is formed in the vertical power MOSFET shown in FIG. 18.
Figure 23:
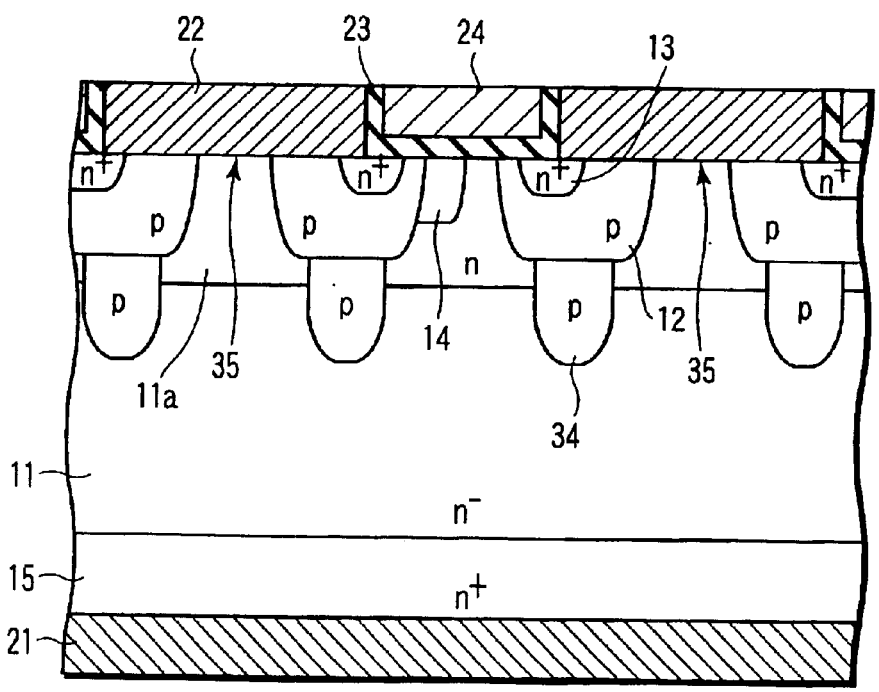
FIG. 23 is a cross-sectional view showing an example that a Schottky junction is formed in the vertical power MOSFET shown in FIG. 20.

When the Schottky junction 35 is formed and the n-type buffer layer 33 is inserted as shown in FIG. 22, and also when the Schottky junction 35 is formed and the p-type buffer layer 34 is inserted as shown in FIG. 23, it is possible to achieve both a reduction in a loss and a reduction in noise at the recovery time. Similarly, as the MOSFET that has the Schottky junction 35 formed and that has the n-type buffer layer 33 or the p-type buffer layer 34 inserted, it is also possible to apply the invention to the MOSFET having a gate electrode of a trench type structure.

In the examples (shown in FIG. 21 to FIG. 23) of the embodiment, it is explained that the n-type low-resistance layers 11a is formed in the MOSFET. However, it is also possible to apply the invention to the MOSFET in which the n-type low-resistance layers 11a is not formed.

(Fourth Embodiment)

Figure 24:
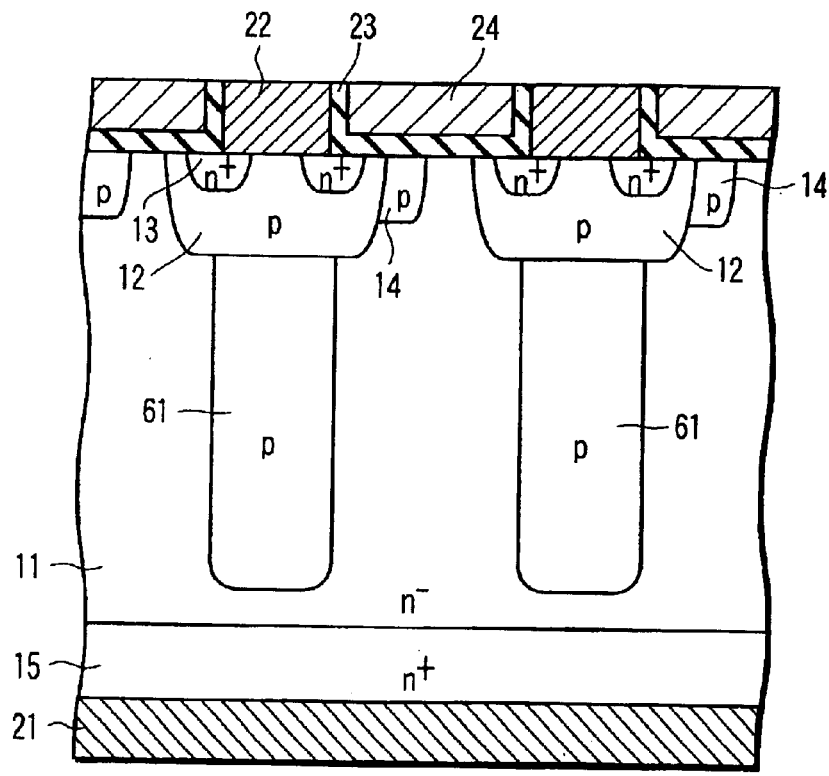
FIG. 24 is a cross-sectional view showing an example of the application of the invention to a power MOSFET that has a superjunction structure according to a fourth embodiment of the present invention.

FIG. 24 shows a structure example of a vertical power MOSFET according to a fourth embodiment of the present invention. The present embodiment shows an example that a superjunction structure is formed.

In FIG. 24, a plurality of p-type base layers 12 are selectively formed by diffusion as second semiconductor layers on one surface of an n$^-$-type drift layer 11 as a first semiconductor layer. The p-type base layers 12 have constant intervals (pitches) between them in a direction parallel with the front surface of an element, and are disposed in a stripe shape along a direction orthogonal with the front surface of the element. A plurality of n$^+$-type source layers 13 are selectively formed by diffusion as third semiconductor layers on the surface of the p-type base layers 12. The n$^+$-type source layers 13 are provided in a stripe shape along the p-type base layers 12.

A p-type layer (a gate-underlying p-type layer) 14 is selectively formed by diffusion as a fifth semiconductor layer on the surface of the n$^-$-type drift layer 11 between two adjacent p-type base layers 12. In the present embodiment, the p-type layer 14 is provided in a stripe shape on the surface of the n$^-$-type drift layer 11 that is in contact with the p-type layer base 12, along the interface with the p-type base layer 12. In other words, the p-type layer 14 is connected to one of the two adjacent p-type base layers 12. The p-type layer 14 is formed to have impurity concentration lower than that of the p-type base layer 12.

A source electrode 22 having a stripe shape is provided as a first main electrode on the upper surface of the p-type base layer 12 and the n$^+$-type source layer 13, respectively. A gate electrode 24 is provided as a control electrode in a stripe shape between the source electrodes 22 via a gate insulation film (for example, a silicon (Si) oxide film) 23. In other words, the gate electrode 24 of a planar type structure is formed on an area from the n$^+$-type source layer 13 within one of the p-type base layers 12 to the n$^+$-type source layer 13 within the other p-type base layer 12 via the p-type layer 14 and the n$^-$-type drift layer 11. The gate insulation film 23 is formed to have substantially a constant film thickness (for example, about 0.1 μm).

A plurality of p-type pillar layers (eleventh semiconductor layers) 61 are connected to the p-type base layers 12 within the n$^-$-type drift layer 11. In other words, the p-type pillar layers 61 are disposed in a stripe shape in a direction orthogonal with the front surface of the element.

An n⁺-type drain layer 15 is formed as a fourth semiconductor layer on the rear surface (the other surface) of the n⁻-type drift layer 11. A drain electrode 21 is connected as a second main electrode on the entire surface of the n⁺-type drain layer 15.

In the MOSFET that has the superjunction structure formed by providing the p-type pillar layer 61 in the n⁻-type drift layer 11, it is possible to increase the impurity concentration of the n⁻-type drift layer 11, thereby to realize the low-on resistance. Further, based on the formation of the p-type layer 14, it is possible to reduce switching noise.

Figure 25:
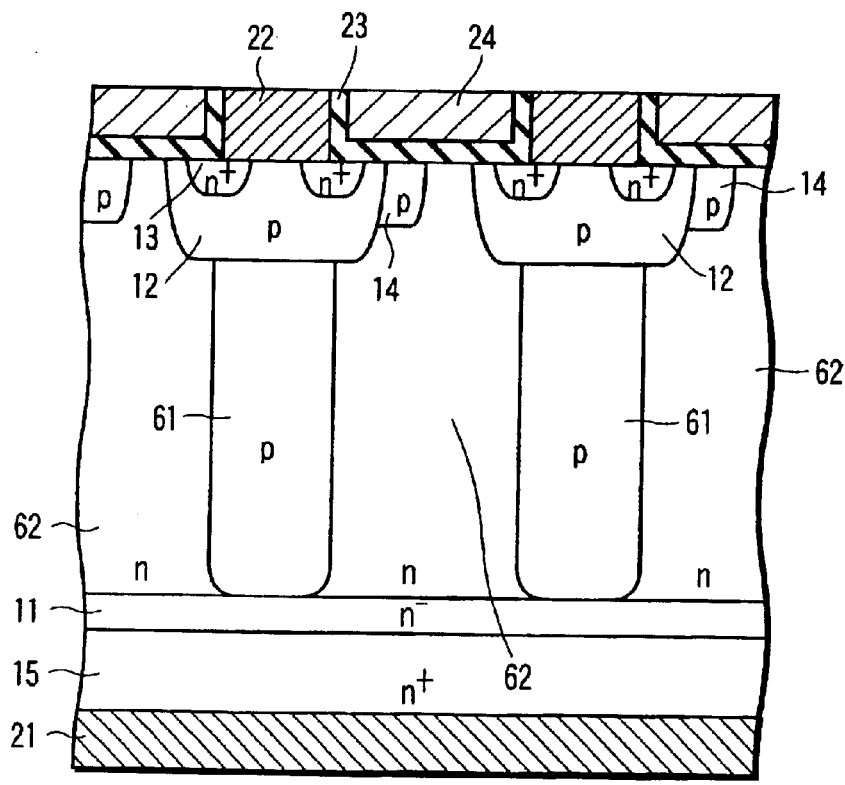
FIG. 25 is a cross-sectional view showing an example of the application of the invention to a power MOSFET that has a superjunction structure (multi RESURF structure) according to the fourth embodiment of the present invention.

The structure of the power MOSFET having the superjunction structure is not limited to the above. For example, as shown in FIG. 25, it is also possible to apply the present invention to a power MOSFET having a resurf structure that has the plurality of p-type pillar layers 61 and a plurality of n-type pillar layers (twelfth semiconductor layers) 62 disposed periodically on the n⁻-type drift layer 11.

While the superjunction structure is formed on the entire surface of the n-type drift layer 11 in the above example, the structure is not limited to this. It is also possible to apply the invention to a MOSFET that has a superjunction structure formed on a part of the n⁻-type drift layer 11.

While the period of the superjunction structure and the period of the MOS cells coincide with each other in the above example, these structures may be different. It is also possible to form a superjunction structure in a direction orthogonal with the gate electrode.

While the gate electrode of a planar type structure is disposed in a stripe shape in the above example, it is also possible to dispose the gate electrode in a lattice shape or in zigzag. Alternatively, a gate electrode of a trench type structure may be disposed in a stripe shape, or a lattice shape, or in zigzag.

In the above embodiments, it is explained that a first conductivity type is an n type, and a second conductivity type is a p type. However, the conductivity types are not limited to the above. In each embodiment, it is also possible to use a p type for the first conductivity type, and an n type for the second conductivity type.

In the above embodiments, the use of silicon (Si) has been explained. However, it is also possible to apply the present invention to an element that uses compound semiconductor such as silicon carbide (SiC), gallium nitride (GaN), and aluminum nitride (AlN), or diamond.

In the above embodiments, the application of the present invention is not limited to the MOSFET having a superjunction structure, or a vertical switching element. It is also possible to apply the invention in a similar manner to a MOS or MIS gate element such as a lateral MOSFET and an IGBT.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An insulated gate semiconductor device comprising:
   a first semiconductor layer of a first conductivity type;
   a plurality of second semiconductor layers of a second conductivity type selectively formed on a surface of the first semiconductor layer of the first conductivity type;
   at least one third semiconductor layer of the first conductivity type selectively formed on a surface of each of said plurality of second semiconductor layers of the second conductivity type;
   a plurality of first main electrodes connected to said plurality of second semiconductor layers of the second conductivity type and said at least one third semiconductor layer of the first conductivity type, respectively;
   a fourth semiconductor layer of the first conductivity type formed on a rear surface of the first semiconductor layer of the first conductivity type;
   a second main electrode connected to the fourth semiconductor layer of the first conductivity type;
   at least one control electrode formed via a gate insulation film on the surface of the first semiconductor layer of the first conductivity type, including said plurality of second semiconductor layers of the second conductivity type and said at least one third semiconductor layer of the first conductivity type;
   at least one fifth semiconductor layer of the second conductivity type disposed on an interface of the first semiconductor layer of the first conductivity type in contact with said at least one control electrode, and connected to at least one of said plurality of second semiconductor layers of the second conductivity type, the fifth semiconductor layer having impurity concentration lower than that of said plurality of second semiconductor layers of the second conductivity type; and
   a ninth semiconductor layer of the first conductivity type provided between the first semiconductor layer of the first conductivity type and the fourth semiconductor layer of the first conductivity type.

2. The insulated gate semiconductor device according to claim 1, wherein the first semiconductor layer of the first conductivity type is connected to the first main electrode, and a Schottky junction is formed at a connection section between the first semiconductor layer and the first main electrode.

3. The insulated gate semiconductor device according to claim 1, wherein a low-resistance layer of the first conductivity type having impurity concentration higher than that of the first semiconductor layer of the first conductivity type is further provided on the surface of the first semiconductor layer of the first conductivity type.

4. The insulated gate semiconductor device according to claim 3, wherein the low-resistance layer of the first conductivity type is connected to the first main electrode, and a Schottky junction is formed at a connection section between the low-resistance layer and the first main electrode.

5. The insulated gate semiconductor device according to claim 1, wherein said at least one control electrode has a planar type structure.

6. The insulated gate semiconductor device according to claim 1, wherein said at least one control electrode has a trench type structure.

7. An insulated gate semiconductor device comprising:
   a first semiconductor layer of a first conductivity type;
   a plurality of second semiconductor layers of a second conductivity type selectively formed on a surface of the first semiconductor layer of the first conductivity type;
   at least one third semiconductor layer of the first conductivity type selectively formed on a surface of each of said plurality of second semiconductor layers of the second conductivity type;
   a plurality of first main electrodes connected to said plurality of second semiconductor layers of the second conductivity type and said at least one third semiconductor layer of the first conductivity type, respectively;

a fourth semiconductor layer of the first conductivity type formed on a rear surface of the first semiconductor layer of the first conductivity type;

a second main electrode connected to the fourth semiconductor layer of the first conductivity type;

at least one control electrode formed via a gate insulation film on the surface of the first semiconductor layer of the first conductivity type, including said plurality of second semiconductor layers of the second conductivity type and said at least one third semiconductor layer of the first conductivity type;

at least one fifth semiconductor layer of the second conductivity type disposed on an interface of the first semiconductor layer of the first conductivity type in contact with said at least one control electrode, and connected to at least one of said plurality of second semiconductor layers of the second conductivity type, the fifth semiconductor layer having impurity concentration lower than that of said plurality of second semiconductor layers of the second conductivity type; and a tenth semiconductor layer of the second conductivity type provided in contact with bottom surfaces of said plurality of second semiconductor layer of the second conductivity type, respectively.

8. The insulated gate semiconductor device according to claim 7, wherein the first semiconductor layer of the first conductivity type is connected to the first main electrode, and a Schottky junction is formed at a connection section between the first semiconductor layer and the first main electrode.

9. The insulated gate semiconductor device according to claim 7, wherein a low-resistance layer of the first conductivity type having impurity concentration higher than that of the first semiconductor layer of the first conductivity type is further provided on the surface of the first semiconductor layer of the first conductivity type.

10. The insulated gate semiconductor device according to claim 9, wherein the low-resistance layer of the first conductivity type is connected to the first main electrode, and a Schottky junction is formed at a connection section between the low-resistance layer and the first main electrode.

11. The insulated gate semiconductor device according to claim 7, wherein said at least one control electrode has a planar type structure.

12. The insulated gate semiconductor device according to claim 7, wherein said at least one control electrode has a trench type structure.

13. An insulated gate semiconductor device comprising:

a first semiconductor layer of a first conductivity type;

a plurality of second semiconductor layers of a second conductivity type selectively formed on a surface of the first semiconductor layer of the first conductivity type;

at least one third semiconductor layer of the first conductivity type selectively formed on a surface of each of said plurality of second semiconductor layers of the second conductivity type;

a plurality of first main electrodes connected to the first semiconductor layer of the first conductivity type, said plurality of second semiconductor layers of the second conductivity type, and said at least one third semiconductor layer of the first conductivity type, respectively;

a fourth semiconductor layer of the first conductivity type formed on a rear surface of the first semiconductor layer of the first conductivity type;

a second main electrode connected to the fourth semiconductor layer of the first conductivity type;

at least one control electrode formed via a gate insulation film on the surface of the first semiconductor layer of the first conductivity type, including said plurality of second semiconductor layers of the second conductivity type and said at least one third semiconductor layer of the first conductivity type; and at least one fifth semiconductor layer of the second conductivity type disposed on an interface of the first semiconductor layer of the first conductivity type in contact with said at least one control electrode, and connected to at least one of said plurality of second semiconductor layers of the second conductivity type, the fifth semiconductor layer having impurity concentration lower than that of said plurality of second semiconductor layers of the second conductivity type, wherein a Schottky junction is formed at a connection section between the first semiconductor layer of the first conductivity type and the first main electrode.

14. The insulated gate semiconductor device according to claim 13, wherein a low-resistance layer of the first conductivity type having impurity concentration higher than that of the first semiconductor layer of the first conductivity type is further provided on the surface of the first semiconductor layer of the first conductivity type, and the Schottky junction is formed at a connection section between the low-resistance layer of the first conductivity type and the first main electrode.

15. The insulated gate semiconductor device according to claim 13, wherein a ninth semiconductor layer of the first conductivity type is further provided between the fourth semiconductor layer of the first conductivity type and the first semiconductor layer of the first conductivity type.

16. The insulated gate semiconductor device according to claim 13, wherein a tenth semiconductor layer of the second conductivity type is further connected to the bottom surfaces of said plurality of second semiconductor layers of the second conductivity type.

17. The insulated gate semiconductor device according to claim 13, wherein said at least one control electrode has a planar type structure.

18. The insulated gate semiconductor device according to claim 13, wherein said at least one control electrode has a trench type structure.

19. An insulated gate semiconductor device comprising:

a first semiconductor layer of a first conductivity type;

a plurality of eleventh semiconductor layers of a second conductivity type selectively formed on a surface of the first semiconductor layer of the first conductivity type;

a plurality of second semiconductor layers of the second conductivity type selectively formed on the surface of the first semiconductor layer of the first conductivity type including surfaces of said plurality of eleventh semiconductor layers of the second conductivity type;

at least one third semiconductor layer of the first conductivity type selectively formed on a surface of each of said plurality of second semiconductor layers of the second conductivity type;

a plurality of first main electrodes connected to said plurality of second semiconductor layers of the second conductivity type and said at least one third semiconductor layer of the first conductivity type, respectively;

a fourth semiconductor layer formed on a rear surface of the first semiconductor layer of the first conductivity type;

a second main electrode connected to the fourth semiconductor layer;

at least one control electrode formed via a gate insulation film on the surface of the first semiconductor layer of the first conductivity type, including said plurality of second semiconductor layers of the second conductivity type and said at least one third semiconductor layer of the first conductivity type; and at least one fifth semiconductor layer of the second conductivity type disposed on an interface of the first semiconductor layer of the first conductivity type in contact with said at least one control electrode, and connected to at least one of said plurality of second semiconductor layers of the second conductivity type, the fifth semiconductor layer having impurity concentration lower than that of said plurality of second semiconductor layers of the second conductivity type.

20. The insulated gate semiconductor device according to claim 19, wherein a plurality of twelfth semiconductor layers of the first conductivity type are further provided on the surface of the first semiconductor layer of the first conductivity type.

21. The insulated gate semiconductor device according to claim 20, wherein said plurality of twelfth semiconductor layers of the first conductivity type and said plurality of eleventh semiconductor layers of the second conductivity type are disposed periodically on the first semiconductor layer of the first conductivity type.

22. The insulated gate semiconductor device according to claim 19, wherein said at least one control electrode has a planar type structure.

23. The insulated gate semiconductor device according to claim 19, wherein said at least one control electrode has a trench type structure.

24. An insulated gate semiconductor device comprising:

a first semiconductor layer of a first conductivity type;

a plurality of second semiconductor layers of a second conductivity type selectively formed on a surface of the first semiconductor layer of the first conductivity type;

at least one third semiconductor layer of the first conductivity type selectively formed on a surface of each of said plurality of second semiconductor layers of the second conductivity type;

a plurality of first main electrodes connected to said plurality of second semiconductor layers of the second conductivity type and said at least one third semiconductor layer of the first conductivity type, respectively;

a fourth semiconductor layer formed on a rear surface of the first semiconductor layer of the first conductivity type;

a second main electrode connected to the fourth semiconductor layer;

a plurality of control electrodes each having a trench type structure, formed via a gate insulation film and disposed in a stripe shape, on the surface of the first semiconductor layer of the first conductivity type, adjacent to said plurality of second semiconductor layers of the second conductivity type and said at least one third semiconductor layer of the first conductivity type, respectively;

a plurality of fifth semiconductor layers of the second conductivity type which are disposed on an interface of the first semiconductor layer of the first conductivity type in contact with bottom surface of said plurality of control electrodes, and the fifth semiconductor layers having impurity concentration lower than that of said plurality of second semiconductor layers of the second conductivity type, and at least one eighth semiconductor layer of the second conductivity type, which connects at least one of said plurality of second semiconductor layers of the second conductivity type to the plurality of fifth semiconductor layers of the second conductivity type.

25. The insulated gate semiconductor device according to claim 24, wherein said plurality of second semiconductor layers of the second conductivity type are provided in a stripe shape along said plurality of control electrodes, respectively.

26. The insulated gate semiconductor device according to claim 24, wherein said at least one third semiconductor layer of the first conductivity type is provided in a stripe shape along said plurality of control electrodes, respectively.

27. The insulated gate semiconductor device according to claim 24, wherein the fourth semiconductor layer comprises a semiconductor layer of the first conductivity type.

28. The insulated gate semiconductor device according to claim 24, wherein the fourth semiconductor layer comprises a semiconductor layer of the second conductivity type.

29. The insulated gate semiconductor device according to claim 28, wherein a sixth semiconductor layer of the first conductivity type is further provided between the fourth semiconductor layer and the first semiconductor layer of the first conductivity type.

* * * * *